United States Patent
Saraf

(10) Patent No.: US 6,448,829 B1
(45) Date of Patent: Sep. 10, 2002

(54) LOW HOLD TIME STATISIZED DYNAMIC FLIP-FLOP

(75) Inventor: Ritesh Saraf, Milpitas, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/876,765

(22) Filed: Jun. 7, 2001

(51) Int. Cl.[7] ................................................. H03K 3/12
(52) U.S. Cl. ...................... 327/200; 327/218; 327/211; 327/213
(58) Field of Search ................................ 327/199, 200, 327/201–203, 208–213, 214, 215, 218, 219; 326/95–98

(56) References Cited

U.S. PATENT DOCUMENTS 5,764,089 A * 6/1998 Partovi et al. .............. 327/200
5,825,224 A * 10/1998 Klass et al. ................. 327/200
5,898,330 A * 4/1999 Klass .......................... 327/210
5,917,355 A * 6/1999 Klass .......................... 327/208
5,920,218 A * 7/1999 Klass et al. ................. 327/200
5,933,038 A * 8/1999 Klass .......................... 327/208
6,023,179 A * 2/2000 Klass .......................... 327/211
6,121,807 A * 9/2000 Klass et al. ................. 327/218
6,265,923 B1 * 7/2001 Amir et al. ................. 327/218

* cited by examiner

Primary Examiner—Terry D. Cunnigham
Assistant Examiner—Long Nguyen
(74) Attorney, Agent, or Firm—Rosenthal & Osha L.L.P.

(57) ABSTRACT

A low hold time flip-flop that has a dynamic input stage and a static output stage is provided. The flip-flop uses a feedback stage to maintain a value on a dynamic node during an evaluation phase of the flip-flop so that an input to the flip-flop only has to be held for a relatively short period of time after the start of the evaluation phase.

22 Claims, 12 Drawing Sheets

LOW HOLD TIME STATISIZED DYNAMIC FLIP-FLOP

BACKGROUND OF INVENTION

The design of a computer system may be broken down into three parts—system design, logic design, and circuit design. System design involves breaking the overall system into subsystems and specifying the characteristics of each subsystem. For example, system design of a computer system could involve specifying the number and type of memory units, arithmetic units, and input-output devices as well as the interconnection and control of these subsystems. Logic design involves determining how to interconnect basic logic building blocks to perform a specific function. An example of logic design is determining the interconnection of logic gates and flip-flops to perform binary addition. Circuit design involves specifying the interconnection of specific components such as resistors, diodes, and transistors to form logic building blocks.

One such logic building block is a flip-flop. A flip-flop is a memory element that that provides storage for at least one bit, i.e., it can at least store a '1' or a '0.' A type of flip-flop commonly used by high performance circuits is a static flip-flop (discussed below with reference to FIG. 1).

An important aspect of circuit design is how logic building blocks, such as flip-flops, are actually implemented in a computer system. A typical approach used to implement logic building blocks is through the use of complementary metal-oxide-semiconductor ("CMOS") logic families. CMOS logic families use metal-oxide-semiconductor field-effect transistors ("MOSFETs").

The use of MOSFET transistors is beneficial because lower currents are needed to operate these transistors than other types of devices. However, MOSFETs operate slower than devices used in other logic families. MOSFETs may be divided into two types of transistors: positive-channel metal-oxide semiconductor ("PMOS") transistors and negative-channel metal-oxide semiconductor ("NMOS") transistors. A transistor is 'on' when there is an electrical pathway across the transistor such that a voltage at one terminal of the transistor can be seen at another terminal of the transistor. NMOS transistors can be switched 'on' or 'off' by the movement of electrons, whereas PMOS transistors can be switched 'on' or 'off' by the movement of electron vacancies. Every MOSFET has a voltage threshold ("$V_T$") value, which is the voltage level at which the MOSFET switches 'on' or 'off.' Generally, an NMOS transistor switches 'on' when there is a high logic level applied to the input of the NMOS transistor and a PMOS transistor switches 'on' when there is a low logic level, e.g., ground, applied to the input of the PMOS transistor.

An implementation where the use of MOSFETs is exemplified involves a static flip-flop. FIG. 1 shows a circuit schematic of a typical conventional static flip-flop (10). The static flip-flop (10) includes a master stage (12) that drives a slave stage (14). Such static flip-flops are also known as "master-slave static flip-flops."

The master stage (12) includes a first transmission gate (16) that is formed by a first PMOS transistor (18) and a first NMOS transistor (20), where the first PMOS transistor (18) and the first NMOS transistor (20) are in parallel. A data input, DATA, serves as an input to the master stage (12), and, in turn, serves as an input to the first transmission gate (16).

The first transmission gate (16) outputs to a first inverter (22), which, in turn, outputs to both the slave stage (14) and a second inverter (24). The second inverter (24) outputs back to the input of the first inverter (22). The configuration of the first and second inverters (22, 24) allows the value outputted to the slave stage (14) to be held constant when the first transmission gate (16) is switched 'off,' i.e., when data cannot pass through the first transmission gate (16).

The slave stage (14) includes a second transmission gate (26) formed by a second PMOS transistor (28) and a second NMOS transistor (30), where the second PMOS transistor (28) and the second NMOS transistor (30) are in parallel. The value outputted by the first inverter (22) in the master stage (12) serves as an input to the second transmission gate (26).

The second transmission gate (26) outputs to a third inverter (32), which, in turn, outputs to both an output, OUT, of the static flip-flop (10) and a fourth inverter (34). The fourth inverter (34) outputs back to the input of the third inverter (32). The configuration of the third and fourth inverters (32, 34) allows the value outputted to OUT to be held constant when the second transmission gate (26) is switched 'off,' i.e., when data cannot pass through the second transmission gate (26).

A clock signal, CLK, serves as an input to the first PMOS transistor (18), and an inverted clock signal, INV_CLK, serves as an input to the first NMOS transistor (20). Alternatively, CLK serves as an input to the second NMOS transistor (30), and INV_CLK serves as an input to the second PMOS transistor (28).

When CLK is at a low logic level (also referred to also as being "low") and INV_CLK is accordingly at a high logic level (also referred to as being "high"), the first transmission gate (16) switches 'on,' i.e., conducts, because the first PMOS transistor (18) switches 'on' due to the low value of CLK at its input and because the first NMOS transistor (20) switches 'on' due to the high value of INV_CLK at its input. Because the first transmission gate (16) is switched 'on,' the value of DATA is able to pass through the first transmission gate (16) to the input of the first inverter (22), which, in turn, outputs the inverse of DATA to both the slave stage (14) and the second inverter (24).

Conversely, because CLK is low and INV_CLK is high, the second transmission gate (26) is switched 'off,' and, as a result, the value outputted from the first inverter (22) is not able to pass through the second transmission gate (26). However, because the second inverter (24) inputs the value outputted by the first inverter (22) and subsequently outputs back to the input of the first inverter (22), the value outputted from the first inverter (22) is held constant at the input of the second transmission gate (26).

When CLK goes high and INV_CLK accordingly goes low, the second transmission gate (26) switches 'on' because the second PMOS transistor (28) switches 'on' due to the low value of INV_CLK at its input and because the second NMOS transistor (30) switches 'on' due to the high value of CLK at its input. Because the second transmission gate (26) is now switched 'on,' the value outputted by the master stage (12) is able to pass through the second transmission gate (26) to the input of the third inverter (32), which, in turn, outputs the inverse of the value outputted by the master stage (12) to both OUT and the fourth inverter (34). Furthermore, because the fourth inverter (34) inputs the value outputted by the third inverter (32) and subsequently outputs back to the input of the third inverter (32), the value outputted from the third inverter (32) is held constant at OUT regardless of whether the second transmission gate (26) switches back 'off.' However, when the master stage (12) again drives the slave stage (14), OUT will change accordingly, i.e., the third and fourth inverters (32, 34) are strong enough to hold the value at OUT, but not strong enough to hold OUT when a value passes from the master stage (12) through the second transmission gate (26) to the input of the third inverter (32).

The static flip-flop (10) shown in FIG. 1 may be modified for testing purposes to include scan test capabilities. FIG. 2 shows a scan capable flip-flop (40) which can conduct both normal mode operations and scan mode operations. Normal mode operations include those operations dependent on actual input data, whereas scan mode operations include those operations dependent on a scan input value.

FIG. 2 includes a scan capable master stage (42) that includes a first transmission gate (44) and a second transmission gate (46). The first transmission gate (44) is formed by a first PMOS transistor (48) and a first NMOS transistor (50), where the first PMOS transistor (48) and the first NMOS transistor (50) are in parallel. A clock signal, CLK, serves as an input to the first PMOS transistor (48), and an inverted clock signal, INV_CLK, serves as an input to the first NMOS transistor (50). Moreover, a data input, DATA, serves as an input to the first transmission gate (44).

The second transmission gate (46) is formed by a second PMOS transistor (52) and a second NMOS transistor (54), where the second PMOS transistor (52) and the second PMOS transistor (54) are in parallel. A scan clock signal, SCLK, serves as an input to the second PMOS transistor (52), and an inverted scan clock signal, INV_SCLK, serves as an input to the second NMOS transistor (54). Moreover, a scan input signal, SI, serves as an input to the second transmission gate (46).

The output of the first transmission gate (44) and the output of the second transmission gate (46) serve as an input to a first inverter (56). The first inverter (56) outputs to both a slave stage (60) and a second inverter (58). The second inverter (58) outputs back to the input of the first inverter (56) to ensure that the value outputted to the slave stage (60) by the first inverter (56) is held constant while the first transmission gate (44) and/or the second transmission gate (46) switch 'off.' The slave stage (60) has the same configuration as that of the slave stage (14) in FIG. 1.

During normal mode operations, SCLK and INV_SCLK are disabled, or, in the alternative, are held constant such that the second transmission gate (46) is switched 'off.' Conversely, CLK and INV_CLK behave normally, and when CLK goes low and INV_CLK accordingly goes high, the first transmission gate (44) switches 'on' and allows the value of DATA to pass through the first transmission gate (44) to the input of the first inverter (56). Thereafter, the first inverter (56) outputs to the slave stage (60), which, in turn, will output the inverted value of the value outputted by the first inverter (56) to an output, OUT, of the scan capable flip-flop (40). However, recall that the slave stage (60) only switches 'on' when the first transmission gate (44) in the master stage (42) switches 'off.'

During scan mode operations, CLK and INV_CLK are disabled, or, in the alternative, are held constant such that the first transmission gate (44) is switched 'off.' Conversely, SCLK and INV_SCLK behave normally, and when SCLK goes low and INV_SCLK accordingly goes high, the second transmission gate (46) switches 'on' and allows the value of SI to pass through the second transmission gate (46) to the input of the first inverter (56). Thereafter, the first inverter (56) outputs to the slave stage (60), which, in turn, will output the inverted value of the value outputted by the first inverter (56) to OUT. However, recall that the slave stage (60) only switches 'on' when the second transmission gate (46) in the master stage (40) switches 'off.'

An alternative to the static flip-flop designs shown in FIGS. 1 and 2 is a flip-flop design that includes a dynamic input stage and a static output stage, and such a design is disclosed in U.S. Pat. No. 5,898,330 as a "statisized dynamic flip-flop."

FIG. 3 shows a block diagram of a statisized dynamic flip-flop (80). A dynamic input stage (82) is coupled to receive a data input, DATA, at a first input lead (84) of the dynamic input stage (82) and to receive a clock signal, CLK, at a second input lead (86) of the dynamic input stage (82). The dynamic input stage (82) outputs to an to output lead (88) an internal signal X. A static output stage (90) has a first input lead (92) connected to the output lead (88) of the dynamic input stage (82) through which the static output stage (90) receives the internal signal X. The static output stage (90) is coupled to receive CLK at a second input lead (94) of the static output stage (90). Further, the static output stage (90) outputs an output signal, OUT, at an output lead (96) of the static output stage (90). The statisized dynamic flip-flop (80) enters a precharge phase when CLK goes low and enters an evaluation phase when CLK goes high.

The statisized dynamic flip-flop (80) operates during the precharge phase as follows. The dynamic input stage (82) causes the internal signal X to be at a predetermined logic level, independent of the value at DATA. In other words, the dynamic input stage (82) causes the internal signal X to go high during the precharge phase regardless of the value at DATA. Conversely, the static output stage (90) maintains the value of OUT at the same value OUT had during the previous evaluation phase, independent of the value of the internal signal X.

The statisized dynamic flip-flop (80) operates during the evaluation phase as follows. The dynamic input stage (82) receives DATA and, in response, causes the internal signal X to have a value dependent on the value of DATA. Particularly, the dynamic input stage (82) causes the internal signal X to be the complement of DATA. As discussed above, before the start of the evaluation phase, the dynamic input stage (82) precharges the internal signal X to high. Then, depending upon the value of DATA at the start of the evaluation phase, the dynamic input stage (82) causes the internal signal X to go low or else remain high. When DATA is high at the initial portion of the evaluation phase, the dynamic input stage (82) causes the internal signal X to go low. Conversely, when DATA is low at the initial portion of the evaluation phase, the dynamic input stage (82) causes the internal signal to remain high.

In addition, the dynamic input stage (82) is implemented so that once the internal signal X goes low during the evaluation phase, the dynamic input stage (82) cannot again cause the internal signal X to have a high value during the same evaluation phase.

Further, a shutoff mechanism (not shown) in the dynamic input stage (82) maintains the value of the internal signal X at high, if the value of DATA does not change to a high value within a relatively short time period from the start of the evaluation phase. This relatively short time period gives the statisized dynamic flip-flop (80) an edge-triggered operation. Therefore, during the evaluation phase, the dynamic input stage (82) provides an internal signal X that either remains stable at a high value throughout the evaluation phase, or else goes from high to low shortly after the rising edge of CLK and remains low throughout the rest of the evaluation phase.

In addition, the transition to the evaluation phase causes the static output stage (90) to generate OUT having a value dependent on the value of the internal signal X from the dynamic input stage (82). Particularly, the static output stage (90) provides OUT having a value that is the complement of the value of the internal signal X. Because the value of the internal signal X remains stable throughout the evaluation phase shortly after the rising edge of CLK, the static output stage (90) provides OUT with a constant value throughout the rest of the clock cycle.

Through the use of the dynamic input stage (82), the setup time of the statisized dynamic flip-flop (80) is zero, i.e., DATA can arrive at the statisized dynamic flip-flop (80) at about the same time as the rising edge of CLK, thereby reducing the latency of the statisized dynamic flip-flop (80).

FIGS. 4a and 4b relate to a circuit schematic of a prior art embodiment of a scan capable statisized dynamic flip-flop. Particularly, FIG. 4a shows a header block (100) for the scan capable statisized dynamic flip-flop and FIG. 4b shows a core block (120) for the scan capable statisized dynamic flip-flop. The header block (100) drives the core block (120) by providing control signals that control the core block (120).

Referring to FIG. 4a, a scan enable signal, SE, which is an input to the header block (100), serves as a first input of a NAND gate (102). A clock signal, CLK, which is also an input to the header block (100), serves as an input to a first inverter (104). The first inverter (104) outputs to a second inverter (106), which, in turn, outputs to a third inverter (108), a fourth inverter (110), and an output, CK, of the header block (100). The third inverter (108) outputs to a second input of the NAND gate (102), which, in turn, outputs to another output, SE_CLK, of the header block (100). The fourth inverter (110) outputs to a fifth inverter (112), which, in turn, outputs to another output, DELAY_CK, of the header block (100). SE_CLK, DELAY_CK, and CK constitute control signals that are provided by the header block (100) to the core block (120) (shown in FIG. 4b).

During normal mode operations, i.e., "scan is disabled," SE is low. Because SE is low, the NAND gate (102) outputs high on SE_CLK. This occurs because when an input to a NAND gate is low, the NAND gate outputs high regardless of the values at other inputs of the NAND gate. Further, during normal mode operations, when CLK is high, the second inverter (106) outputs high on CK (after a two stage delay due to the first inverter (104) and the second inverter (106)) and the fifth inverter (112) outputs low on DELAY_CK (after a four stage delay due to the first, second, fourth, and fifth inverters (104, 106, 110, 112)). Conversely, when CLK is low during normal mode operations, the second inverter (106) outputs low on CK (after a two stage delay due to the first inverter (104) and the second inverter (106)) and the fifth inverter (112) outputs low on DELAY_CK (after a four stage delay due to the first, second, fourth, and fifth inverters (104, 106, 110, 112)).

During scan mode operations, i.e., "scan is enabled," SE is high. Because SE is high, the NAND gate (102) outputs the inverse of the value at its second input. This occurs because when one input to a two-input NAND gate is high, the NAND gate outputs the inverse of the value at its second input. When CLK goes high, the third inverter (108) outputs low (after a three stage delay due to the first, second, and third inverters (104, 106, 108)) to the second input of the NAND gate (102) causing the NAND gate (102) to output high on SE_CLK. Further, during scan mode operations, when CLK goes high, the second inverter (106) outputs high on CK (after a two stage delay due to the first inverter (104) and the second inverter (106)) and the fifth inverter (112) outputs high on DELAY_CK (after a four stage delay due to the first, second, fourth, and fifth inverters (104, 106, 110, 112)).

Conversely, when CLK goes low, the third inverter (108) outputs high (after a three stage delay due to the first, second, and third inverters (104, 106, 108)) to the second input of the NAND gate (102) causing the NAND gate (102) to output low on SE_CLK. Further, during scan mode operations, when CLK goes low, the second inverter (106) outputs low on CK (after a two stage delay due to the first inverter (104) and the second inverter (106)) and the fifth inverter (112) outputs low on DELAY_CK (after a four stage delay due to the first, second, fourth, and fifth inverters (104, 106, 110, 112)).

Referring now to FIG. 4b, the core block (120) of the scan capable statisized dynamic flip-flop inputs the control signals from the header block (100), along with inputting the scan enable signal, SE, a data input signal, DATA, and a scan input signal, SI.

DELAY_CK serves as an input to a first input of an AND gate (122), which, in turn, outputs to a first input of a first NOR gate (124). SE serves as a second input to the first NOR gate (124), which, in turn, outputs to a first NMOS transistor (126). DATA serves as an input to a second NMOS transistor (128) and CK serves as an input to a first PMOS transistor (130), a third NMOS transistor (132), and a fourth NMOS transistor (134). The first NMOS transistor (126) has a terminal connected to an internal node X (internal node X is a dynamic node and is synonymous with the "internal signal X" discussed above with reference to FIG. 3) and has another terminal connected to a terminal of the second NMOS transistor (128). The second NMOS transistor (128), in addition to having a terminal connected to a terminal of the first NMOS transistor (126), has another terminal connected to a terminal of the third NMOS transistor (132). The third NMOS transistor (132), in addition to having a terminal connected to a terminal of the second NMOS transistor (128), has another terminal connected to ground (136) (also referred to as "connected to low").

The internal node X serves as an input to a second input of the AND gate (122), and is also connected to a terminal of the first PMOS transistor (130). The first PMOS transistor (130), in addition to having a terminal connected to the internal node X, has another terminal connected to a voltage source (138) (also referred to as "connected to high"). Further, the internal node X serves as an input to a sixth inverter (140), a second PMOS transistor (142), and a fifth NMOS transistor (144). The sixth inverter (140) outputs to both an input of a third PMOS transistor (146) and an input of a sixth NMOS transistor (148). The third PMOS transistor (146) has a terminal connected to high (138) and has another terminal connected to the internal node X. The configuration of the sixth inverter (140) and the third PMOS transistor (146) is used to hold the internal node X when the internal node X is high.

The sixth NMOS transistor (148) has a terminal connected to the internal node X and has another terminal connected to the terminal of the third NMOS transistor (132) that is connected to the terminal of the second NMOS transistor (128). The second PMOS transistor (142) has a terminal connected to high (138) and has another terminal connected to both an input to a seventh inverter (150) and a terminal of the fourth NMOS transistor (134). The fourth NMOS transistor (134), in addition to having a terminal connected to both a terminal of the second PMOS transistor (142) and the input to the seventh inverter (150), has another terminal connected to a terminal of the fifth NMOS transistor (144). The fifth NMOS transistor (144), in addition to having a terminal connected to a terminal of the fourth NMOS transistor (134), has another terminal connected to ground (136).

The seventh inverter (150) outputs to both an output, OUT, of the scan capable statisized dynamic flip-flop and an eighth inverter (152). The eighth inverter (152) then outputs back to the input of the seventh inverter (150). The configuration of the seventh and eighth inverters (150, 152) ensures that OUT is held at a constant value when OUT is not being driven by either a connection to ground (136) through the fourth and fifth NMOS transistors (134, 144) or a connection to high (138) through the second PMOS transistor (142).

SE_CLK and SI serve as inputs to a second NOR gate (154). The second NOR gate (154) outputs to a seventh NMOS transistor (156). The seventh NMOS transistor (156) has a terminal connected to the internal node X and has another terminal connected to the terminal of the third NMOS transistor (132) that is connected to the terminal of the second NMOS transistor (128).

During normal mode operations, SE is low, and therefore, SE_CLK is high (discussed above with reference to FIG. 4a). Because SE_CLK is high, the second NOR gate (154) outputs low to the input of the seventh NMOS transistor (156) causing the seventh NMOS transistor (156) to switch or remain 'off.'

The core block (120) of the scan capable statisized dynamic flip-flop enters the precharge phase when CK goes low. When CK goes low, the third NMOS transistor (132) switches 'off,' the fourth NMOS transistor (134) switches 'off,' and the first PMOS transistor (130) switches 'on.' Because the first PMOS transistor (130) switches 'on,' the internal node X gets connected to high (138) through the first PMOS transistor (130). Because the internal node X goes high, the fifth NMOS transistor (144) switches 'on' and the second PMOS transistor (142) remains or switches 'off.' Further, because the fourth NMOS transistor (134) and the second PMOS transistor (142) are switched 'off,' the value at OUT is held at the value it had during the previous evaluation phase.

At the start of the evaluation phase, that is, when CK goes high, the third NMOS transistor (132) switches 'on,' the fourth NMOS transistor (134) switches 'on,' and the first PMOS transistor (130) switches 'off.' If the value at DATA is high at the start of the evaluation phase, then the second NMOS transistor (128) switches 'on.' Before the rising edge of DELAY_CK arrives at the second input of the AND gate (122), the AND gate (122) outputs low to the first input of the first NOR gate (124), which, in turn, outputs high to the first NMOS transistor (126) causing the first NMOS transistor (126) to switch 'on.' Because the first, second, and third NMOS transistors (126, 128, 132) are now switched 'on,' the internal node X gets connected to low (136) through the first, second, and third NMOS transistors (126, 128, 132). When the internal node X goes low, the second PMOS transistor (142) switches 'on' causing the input to the seventh inverter (150) to go high due to it getting connected to high (138) through the second PMOS transistor (142). The seventh inverter (150) then outputs low on OUT.

Additionally, when the internal node X goes low, the sixth inverter (140) outputs high to the input of the sixth NMOS transistor (148) causing the sixth NMOS transistor (148) to switch 'on.' When the sixth NMOS transistor (148) switches 'on,' the internal node X also gets connected to low (136) through the sixth and third NMOS transistors (148, 132). Thus, only after a connection is established between ground (136) and the internal node X through the sixth and third NMOS transistors (148, 132), can DATA toggle back low. Else, if a connection between the internal node X and ground (136) through the sixth and third NMOS transistors (148, 132) is not established before DATA goes back low, then the internal node X loses any connection to ground (136) and the core block (120) behaves undesirably. Moreover, the amount of time that DATA must remain high after the start of the evaluation phase is referred to as "hold time." Furthermore, although the transition from the high value at DATA to the low value at OUT is relatively fast, the hold time for DATA is relatively long.

When DATA is low at the start of an evaluation phase, the second NMOS transistor (128) switches or remains 'off.' Because the second NMOS transistor (128) switches 'off,' the internal node X does not get connected to low (136) due to there being no connection to ground (136) through the first, second, and third NMOS transistors (126, 128, 132). Therefore, because the fourth NMOS transistor (134) was 'on' right when CK went high and because the fifth NMOS transistor (144) switches 'on' due to the internal node X being high at the start of the evaluation phase, the input to the seventh inverter (150) gets connected to low (136) through the fourth and fifth NMOS transistors (134, 144). Note that although the first PMOS transistor (130) switches 'off' due to CK going high at the start of the evaluation phase, the internal node X remains high due it being held high by the configuration of the sixth inverter (140) and the third PMOS transistor (146).

During scan mode operations, SE is high. Because SE is high, the first NOR gate (124) outputs low due to the fact that a NOR gate always outputs low when one of its inputs is high. Thus, because the first NOR gate (124) outputs low to the input of the first NMOS transistor (126), the first NMOS transistor (126) remains or switches 'off.'

The core block (120) of the scan capable statisized dynamic flip-flop enters the precharge phase when CK goes low. When CK goes low, the third NMOS transistor (132) switches 'off,' the fourth NMOS transistor (134) switches 'off,' and the first PMOS transistor (130) switches 'on.' Because the first PMOS transistor (130) switches 'on,' the internal node X gets connected to high (138) through the first PMOS transistor (130). Because the internal node X goes high, the fifth NMOS transistor (144) switches 'on' and the second PMOS transistor (142) remains or switches 'off.' Further, because the fourth NMOS transistor (134) and the second PMOS transistor (142) are switched 'off,' the value at OUT is held constant at the value it had during the previous evaluation phase.

At the start of the evaluation phase, that is, when CK goes high, the third NMOS transistor (132) switches 'on,' the fourth NMOS transistor (134) switches 'on,' and the first PMOS transistor (130) switches 'off.' Also, as CK goes high, SE_CLK follows high after a two stage delay (due to the third inverter (108) and the NAND gate (102) shown in FIG. 4a). If the value at SI is high at the start of the evaluation phase (before the rising edge of SE_CLK arrives), then the second NOR gate (154) outputs low to the input of the seventh NMOS transistor (156) causing the seventh NMOS transistor (156) to switch or remain 'off.' Because the first PMOS transistor (130) switches 'off' due to CK going high and because the seventh NMOS transistor (156) switches 'off' due to SI being high and SE_CLK being low, the internal node X does not have either a connection to ground (136) through the seventh and third NMOS transistors (156, 132) or a connection to high (138) through the first PMOS transistor (130). Because the internal node X is not driven by a connection to ground (136) or high (138), the internal node X is held high by the configuration of the sixth inverter (140) and the third PMOS transistor (146). Further, because the internal node X remains high, the fifth NMOS transistor (144) remains 'on' and because the fourth NMOS transistor (134) is switched 'on' due to CK going high, the input to the seventh inverter (150) gets connected to low (136) through the fourth and fifth NMOS transistors (134, 144). The seventh inverter (150) then outputs high on OUT. Once the rising edge of SE_CLK arrives at the first input of the second NOR gate (154), the second NOR gate (154) continues to output low and the seventh NMOS transistor (156) remains switched 'off.'

If the value at SI is low at the start of the evaluation phase (before the rising edge of SE_CLK), then the second NOR gate (154) outputs high to the input of the seventh NMOS transistor (156) causing the seventh NMOS transistor (156) to switch or remain 'on.' The second NOR gate (154) outputs high because both the value of SE_CLK at its first input and the value of SI at its second input are low. Because the seventh NMOS transistor (156) switches or remains 'on,' the internal node X goes low due to it getting connected to low (136) through the seventh and third NMOS transistors (156, 132) (recall that the third NMOS transistor (132) switches 'on' when CK goes high at the beginning of the evaluation phase).

When the internal node X goes low, the second PMOS transistor (142) switches 'on' causing the input to the seventh inverter (150) to get connected to high (138) through the second PMOS transistor (142). The seventh inverter (150) then outputs low on OUT.

Also, when the internal node X goes low, the sixth inverter (140) outputs high to the input of the sixth NMOS transistor (148) causing the sixth NMOS transistor (148) to switch 'on.' When the sixth NMOS transistor (148) switches 'on,' the internal node X gets connected to low (136) through the sixth and third NMOS transistors (148, 132). Thus, even after the rising edge of SE_CLK arrives and causes the seventh NMOS transistor (156) to switch 'off,' the internal node X remains low.

Further, the value at SI has to be held low until after the internal node X gets connected to low (136) through the sixth and third NMOS transistors (148, 132). This is necessary because if SI toggles back high before the internal node X gets connected to low (136) through the sixth and third NMOS transistors (148, 132), then the internal node X loses its connection to ground (136). Further, although the transition from the low value at SI to the low value at OUT is relatively fast, the hold time for SI is relatively long.

As mentioned above in the discussion with reference to FIG. 4b, one important consideration that needs to made in the design of a flip-flop, such as a statisized dynamic flip-flop, deals with the concept of hold time, i.e., the amount of time that data at an input of a circuit must be held after the start of an evaluation phase. In other words, hold time is the amount of time that data at an input must be held constant before it can change without affecting the state of the circuit. Another important concept deals with setup time, i.e., the amount of time that data at an input of a circuit must be present before the start of an evaluation phase. With reference to the scan capable statisized dynamic flip-flop discussed above with reference to FIGS. 4a and 4b, although the scan capable statisized dynamic flip-flop has virtually zero setup time, its hold time is relatively long. This is because although a value on the dynamic node of the statisized dynamic flip-flop is already established due to a data input at the start of an evaluation phase, the data input must be held after the start of the evaluation phase in order for the value on the dynamic node to remain established.

A prior art approach that has been used to reduce the hold time of a statisized dynamic flip-flop is exemplified by the block diagram shown in FIG. 5. FIG. 5 shows a dynamic input stage (160) and a static output stage (162). A clock signal, CLK, serves as an input to both the dynamic input stage (160) and the static output stage (162). In order to reduce the hold time of the statisized flip-flop, two inverters (164, 166) are introduced on a data input, DATA. The hold time is thus reduced by the amount of delay introduced by the inverters (164, 166). However, the setup time is increased by the same amount of delay that the hold time is reduced. Further, the amount of time necessary for DATA to trigger a change at the output, OUT, of the statisized dynamic flip-flop is also increased by the amount of delay that the hold time is reduced.

SUMMARY OF INVENTION

According to one aspect of the present invention, a flip-flop comprises a data setup node on which a first setup value resides during a precharge phase, a dynamic input stage that selectively establishes a value on a dynamic node at a start of an evaluation phase, a feedback stage that selectively establishes a value on the data setup node at the start of the evaluation phase, and a static output stage, where the first setup value is dependent on an input to the flip-flop, and where the value on the dynamic node selectively controls the static output stage.

According to another aspect, a method for performing low hold time operations using a flip-flop comprises inputting a first setup value onto a data setup node during a precharge phase, selectively establishing a value on a dynamic node at a start of an evaluation phase, and selectively establishing a value on the data setup node at the start of the evaluation phase, where the first setup value is dependent on an input to the flip-flop, and where the value established on the data setup node is dependent on the value on the dynamic node.

Other aspects and advantages of the invention will be apparent from the following description and the appended claims.

DETAILED DESCRIPTION

The present invention relates to a method and apparatus for performing data operations using a low hold time statisized dynamic flip-flop. The present invention also relates to a method and apparatus for performing scan operations using a low hold time statisized dynamic flip-flop.

Turning now to the present invention, at the start of an evaluation phase, the value of a data input is immediately latched using a feedback stage so that the hold time needed to keep the data input constant is reduced. More particularly, the present invention uses a dynamic stage that feeds back onto a setup node to hold the value of a data input during an evaluation phase of the dynamic stage regardless of whether the data input transitions after the start of the evaluation phase. Further, during a precharge phase of the dynamic stage, the feedback is disabled to enable data on the setup node to be setup.

Figure 1:
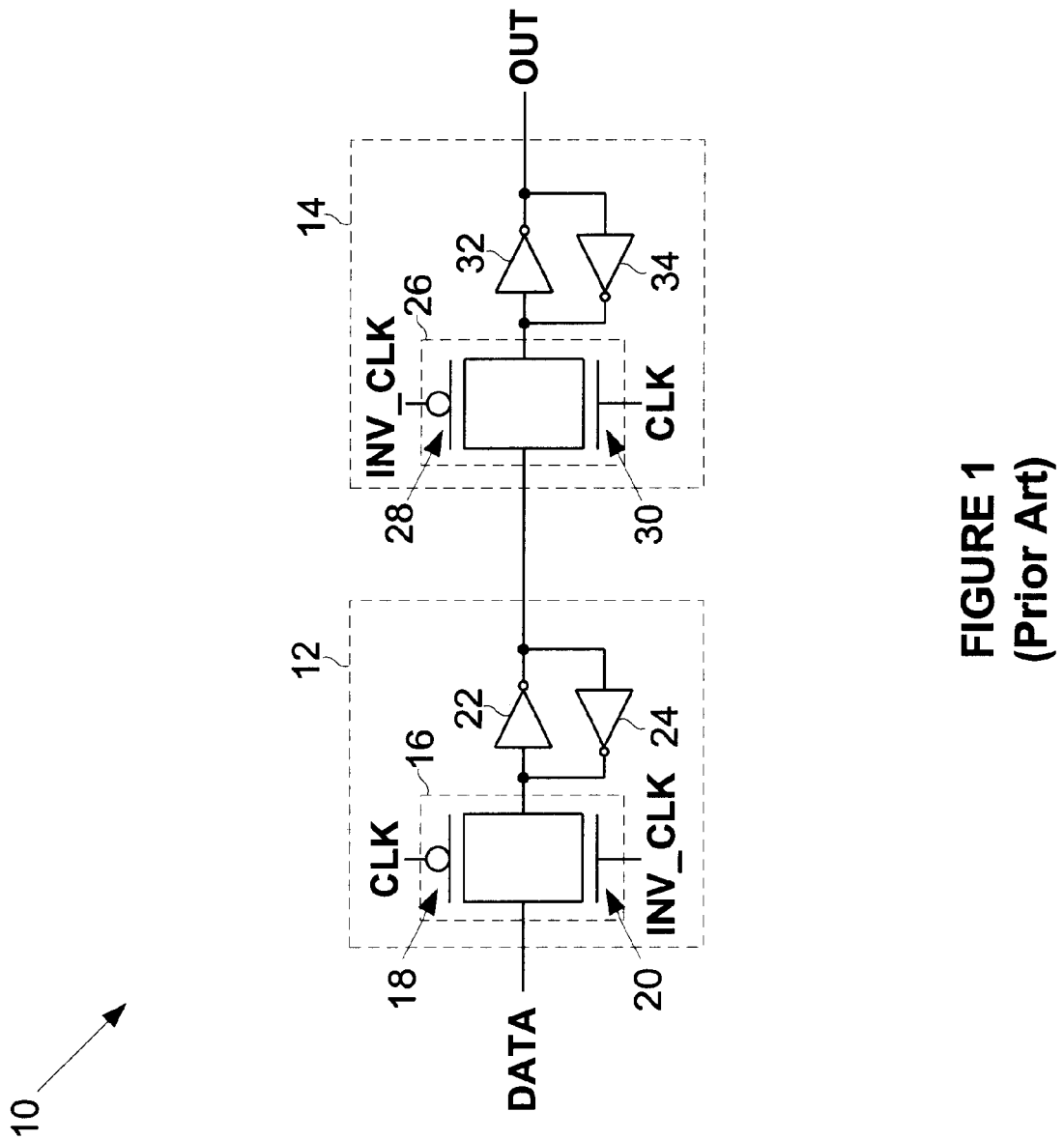
FIG. 1 shows a prior art embodiment of a static flip-flop.
Figure 2:
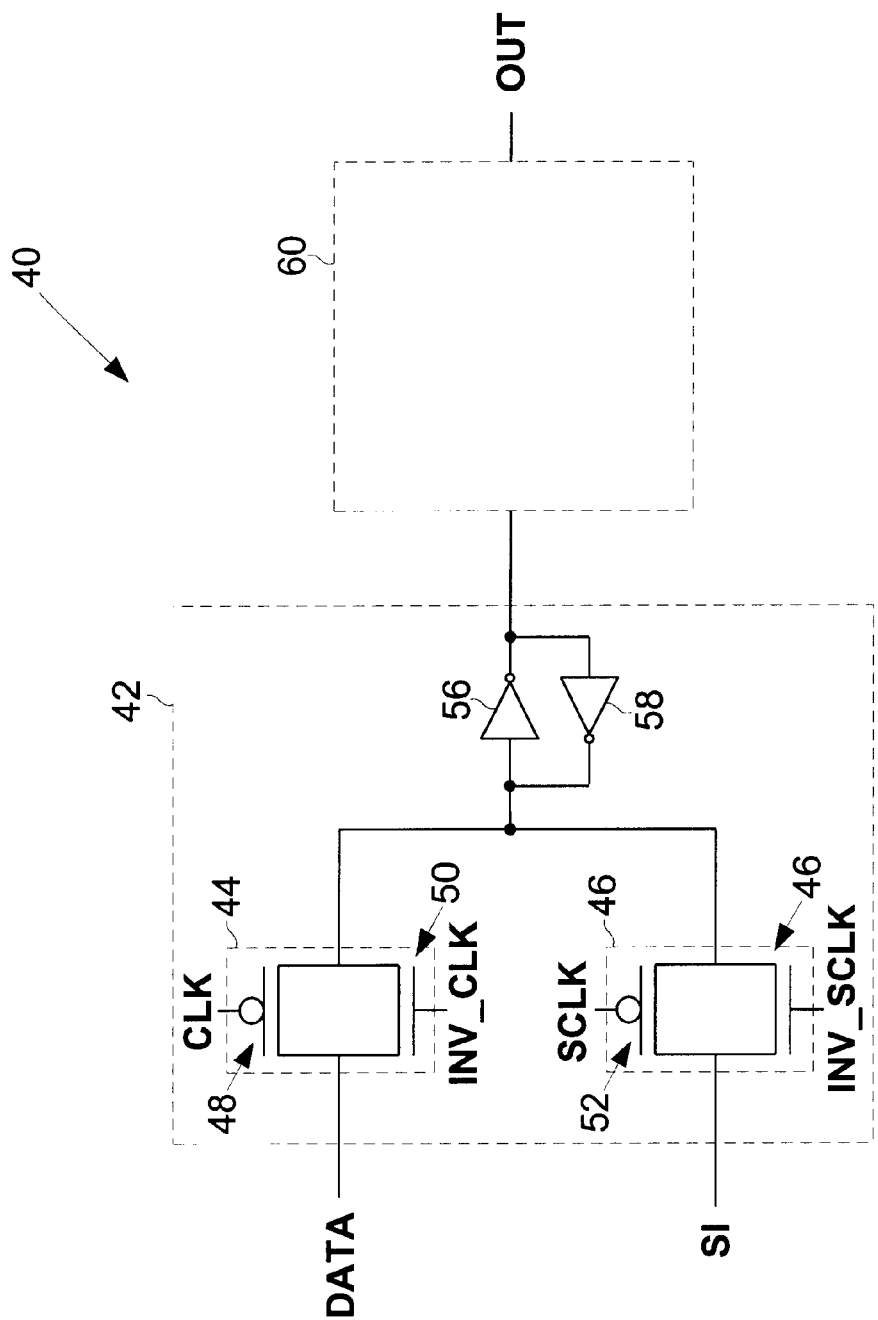
FIG. 2 shows a prior art embodiment of a scan capable flip-flop.
Figure 3:
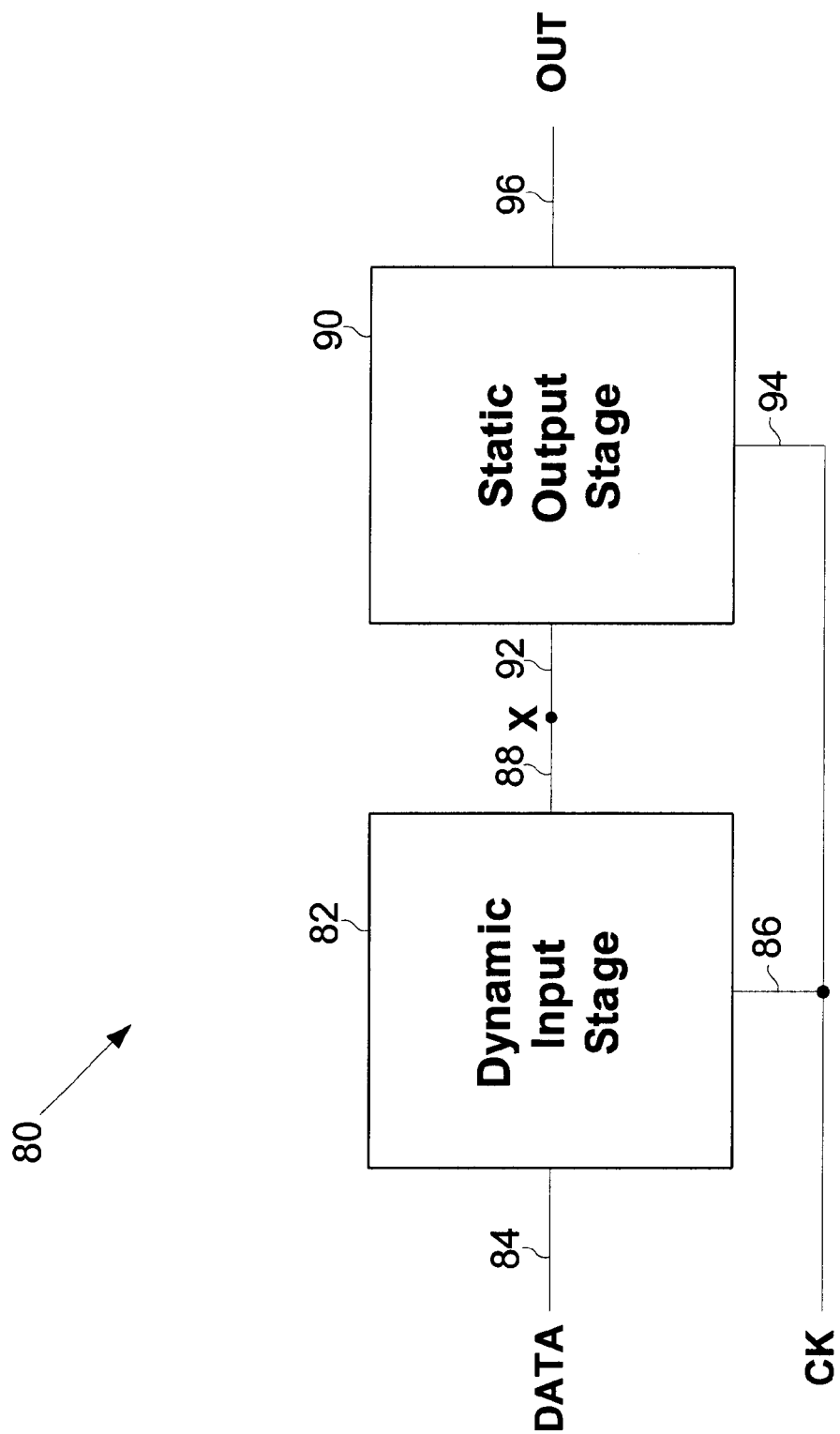
FIG. 3 shows a block diagram of a prior art embodiment of a flip-flop that has a dynamic stage and a static stage.
Figure 4A:
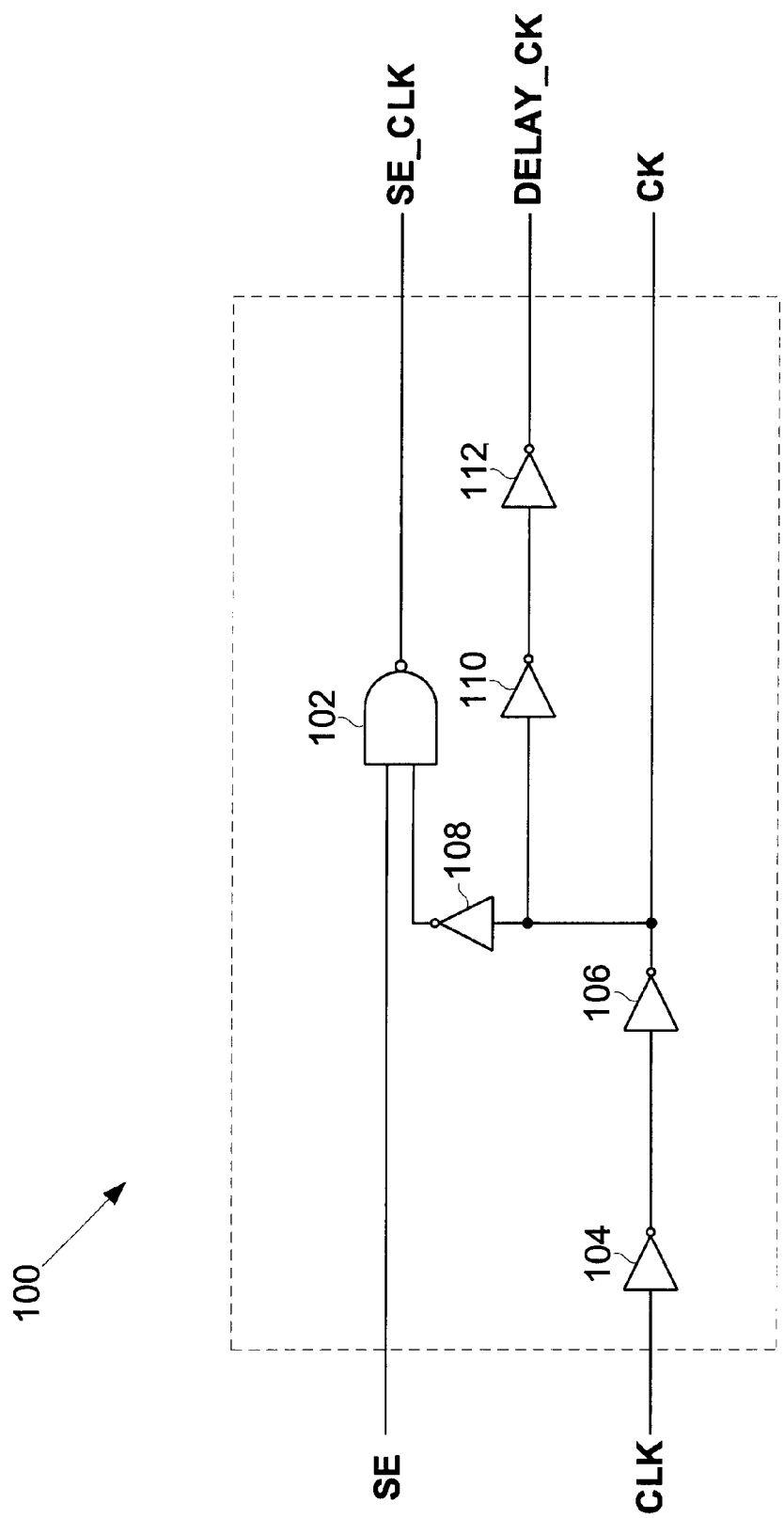
FIG. 4a shows a circuit schematic of a prior art embodiment of a header block of a scan capable statisized dynamic flip-flop.
Figure 4B:
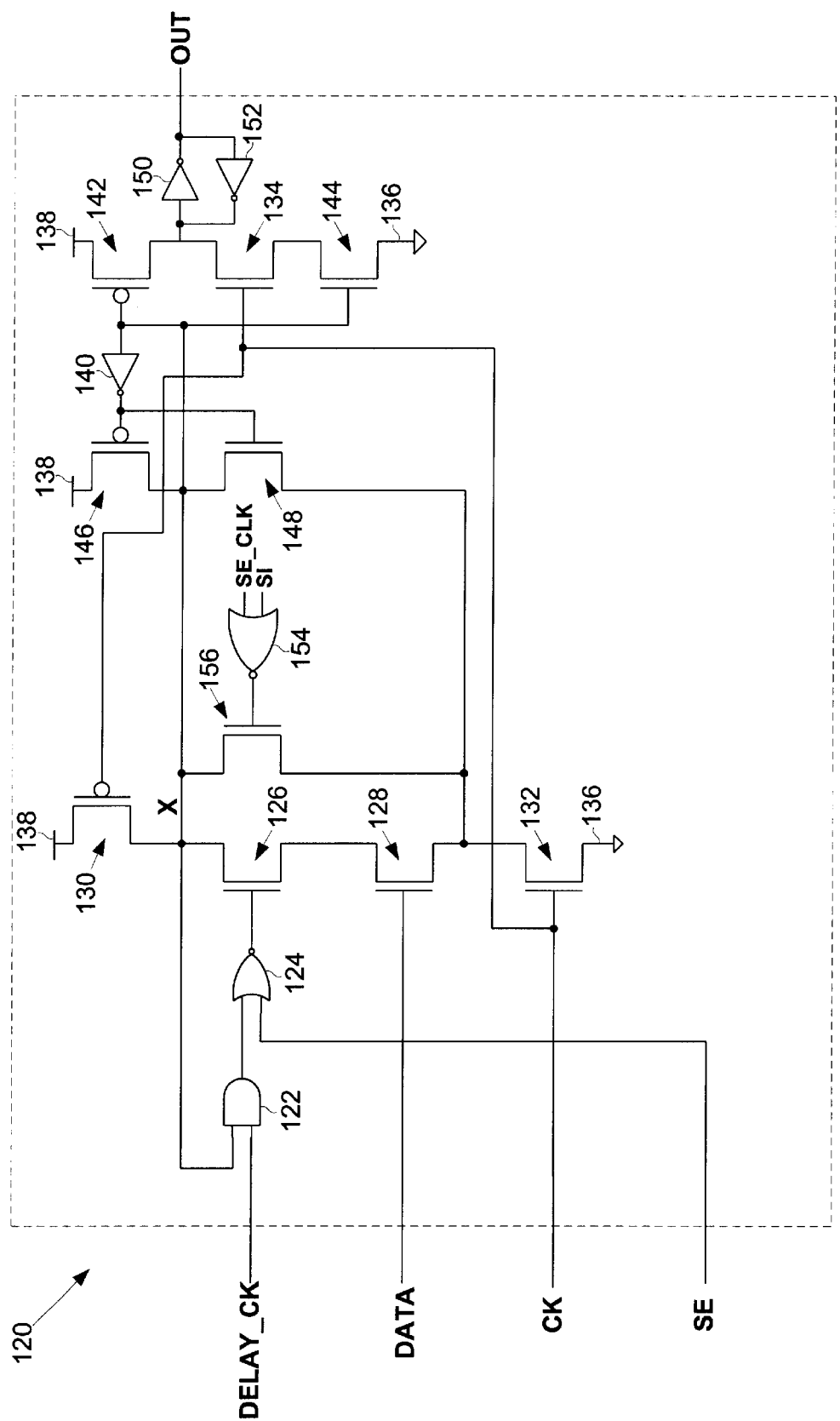
FIG. 4b shows a circuit schematic of a prior art embodiment of a core block of a scan capable statisized dynamic flip-flop.
Figure 5:
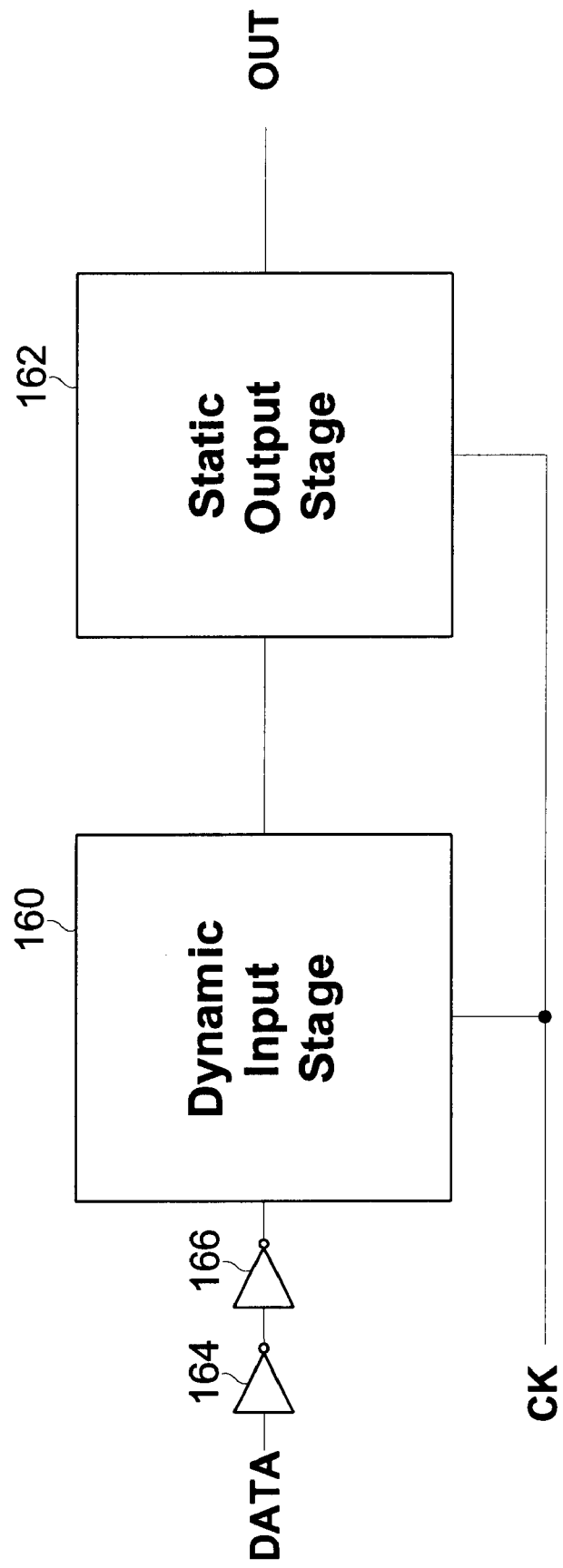
FIG. 5 shows a block diagram of a prior art approach used to reduce hold time of a statisized dynamic flip-flop.
Figure 6A:
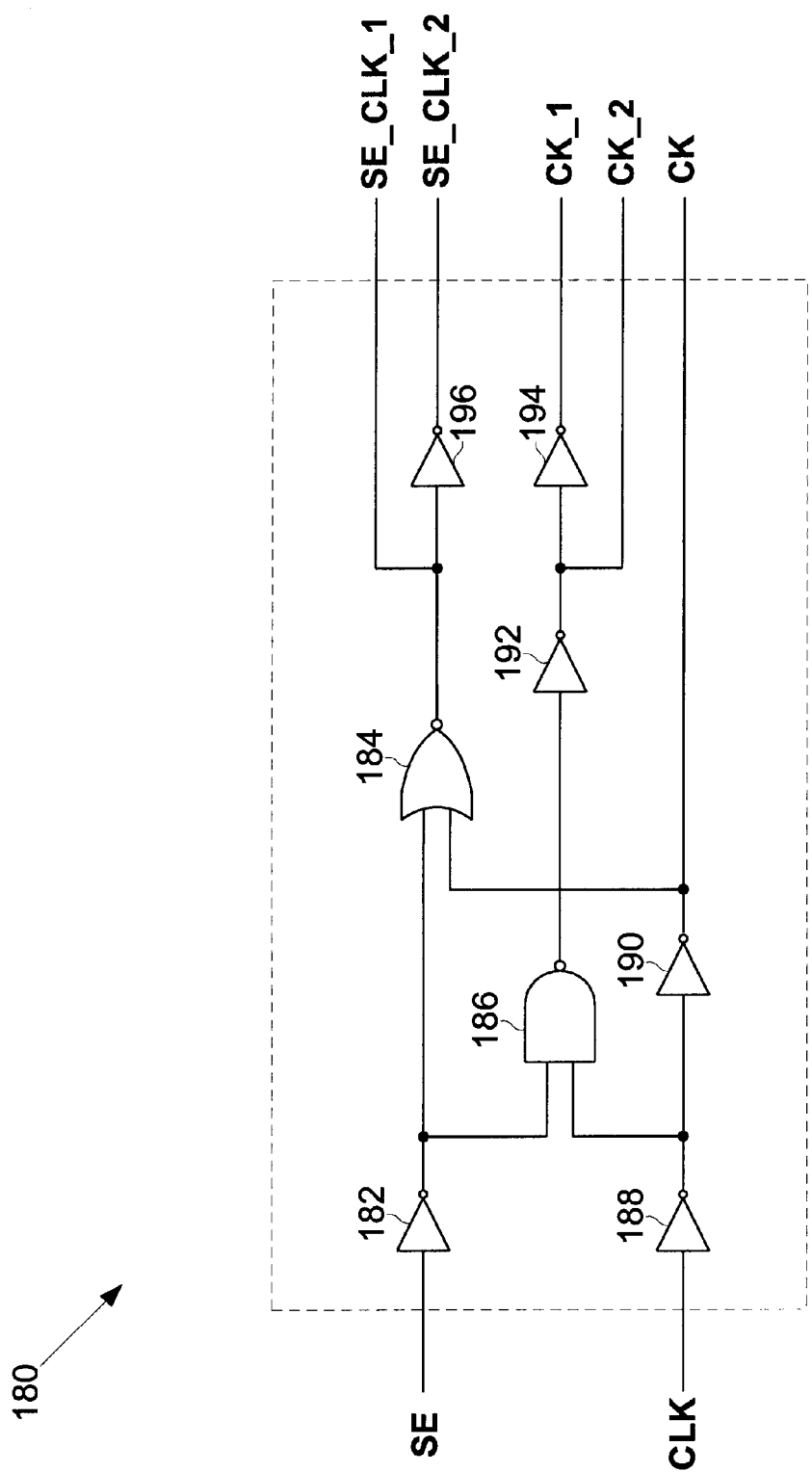
FIG. 6a shows a circuit schematic of a flip-flop header block in accordance with an embodiment of the present invention.

FIG. 6a shows an exemplary circuit schematic of a flip-flop header block (180) in accordance with an embodiment of the present invention. The flip-flop header block (180) provides control signals to a flip-flop core block (200) (shown in FIG. 6b), where the control signals are dependent on input signals to the flip-flop header block (180). Essentially, the flip-flop header block (180) indicates to the flip-flop core block (200) (shown in FIG. 6b), via the control signals, what mode to operate in.

The flip-flop header block (180) shown in FIG. 6a inputs a scan enable signal, SE, and a global clock signal, CLK. SE serves as an input to a first inverter (182), which, in turn, outputs to both a first input of a first NOR gate (184) and a first input of a NAND gate (186). CLK serves as an input to a second inverter (188), which, in turn, outputs to both a third inverter (190) and to a second input of the NAND gate (186). The third inverter (190) outputs to both a second input of the first NOR gate (184) and an output, CK, of the flip-flop header block (180).

The NAND gate (186) outputs to a fourth inverter (192), which, in turn, outputs to both a fifth inverter (194) and another output, CK_2 (discussed below), of the flip-flop header block (180). The fifth inverter (194) outputs to another output, CK_1 (discussed below), of the flip-flop header block (180).

The first NOR gate (184) outputs both to a sixth inverter (196) and to another output, SE_CLK_1 (discussed below), of the flip-flop header block (180). The sixth inverter (196) outputs to another output, SE_CLK_2 (discussed below), of the flip-flop header block (180).

During normal mode operations, SE is low (also referred to as "scan is disabled"). Because SE is low, the first inverter (182) outputs high to both the first input of the first NOR gate (184) and the first input of the NAND gate (186). When an input to a NOR gate is high, its output is low regardless of values at other inputs of the NOR gate. Thus, because the first inverter (182) outputs high to the first input of the first NOR gate (184), the first NOR gate (184) outputs low to both SE_CLK_1 and the sixth inverter (196). The sixth inverter (196) then outputs high on SE_CLK_2.

When one input to a two-input NAND gate is high, its output is the inverse of the value at its second input. Thus, because the first inverter (182) outputs high to the first input of the NAND gate (186), the NAND gate (186) outputs the inverse of the value coming from the second inverter (188). When CLK is high, the second inverter (188) outputs low to both the second input of the NAND gate (186) and to the third inverter (190). The NAND gate (186) then outputs high to the fourth inverter (192), which, in turn, outputs low to both CK_2 and the fifth inverter (194). The fifth inverter (194) then outputs high on CK_1. Moreover, the third inverter (190) outputs high on CK. CK is essentially a delayed and buffered version of CLK.

When CLK is low, the second inverter (188) outputs high to both the second input of the NAND gate (186) and to the third inverter (190). The NAND gate (186) then outputs low to the fourth inverter (192), which, in turn, outputs high to both CK_1 and the fifth inverter (194). The fifth inverter (194) then outputs low on CK_2. Moreover, the third inverter (190) outputs low on CK.

Note that CK_1 and CK_2, which are essentially derived from CLK, are complementary to each other during normal mode operations. Further, because SE_CLK_1 and SE_CLK_2 are low and high, respectively, they are said to be "stable" during normal mode operations. In other words, during normal mode operations, the values of SE_CLK_1 and SE_CLK_2 do not change due to changes in CLK.

Figure 6B:
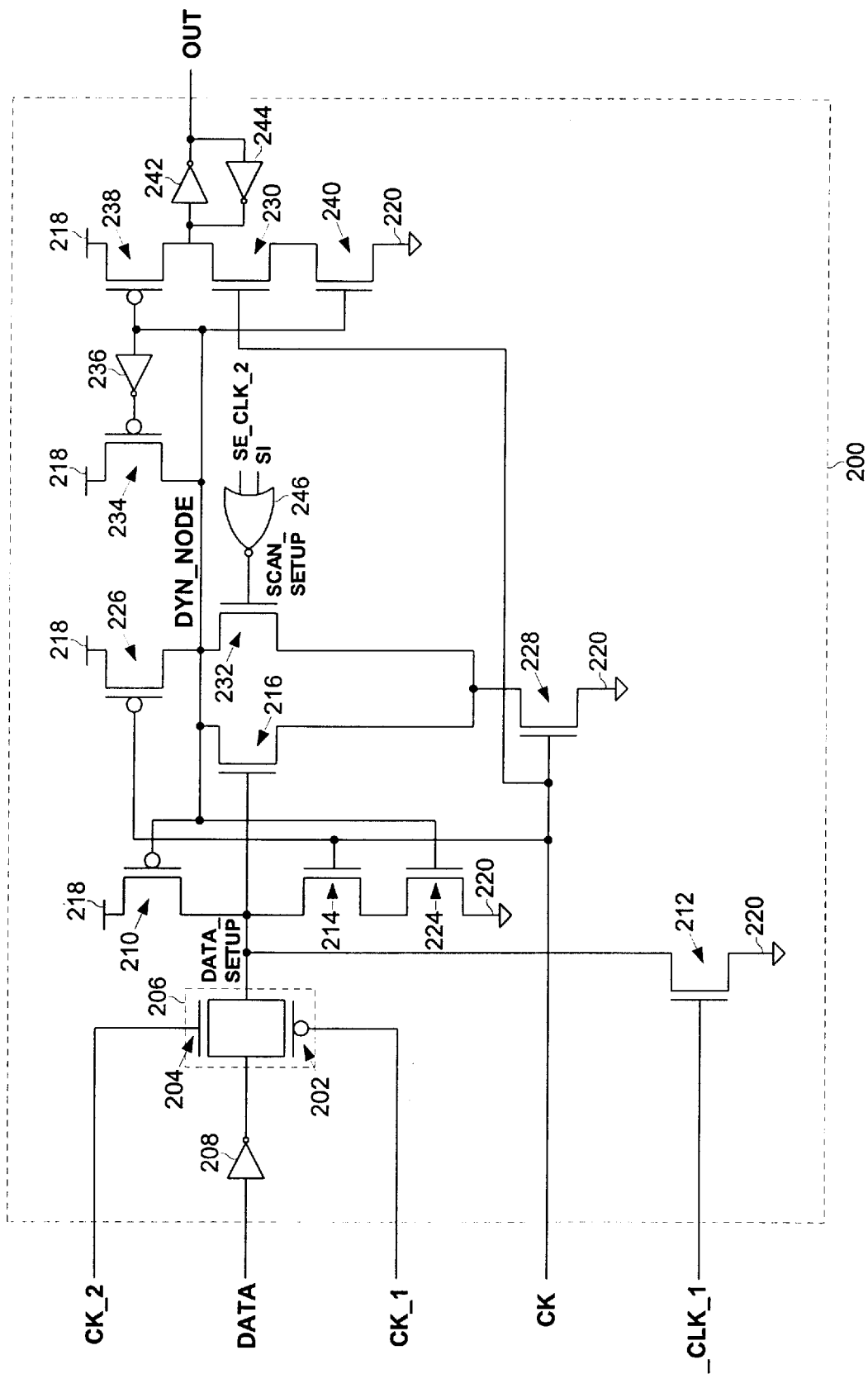
FIG. 6b shows a circuit schematic of a flip-flop core block in accordance with an embodiment of the present invention.

Moreover, those skilled in the art will appreciate that the complementary nature of CK_1 and CK_2 during normal mode operations enables the flip-flop header block (180) to control specific behavior (discussed below with reference to FIG. 6b) within the flip-flop core block (200) (shown in FIG. 6b).

Alternatively, during scan mode operations, SE is high (also referred to as "scan is enabled"). Because SE is high, the first inverter (182) outputs low to both the first input of the first NOR gate (184) and the first input of the NAND gate (186). When an input to a NAND gate is low, its output is high regardless of values at other inputs of the NAND gate. Thus, because the first inverter (182) outputs low to the first input of the NAND gate (186), the NAND gate (186) outputs high to the fourth inverter (192). The fourth inverter (192) then outputs low to both CK_2 and the fifth inverter (194). The fifth inverter (194), in turn, outputs high on CK_1.

When one input to a two-input NOR gate is low, its output is the inverse of the value at its second input. Thus, because the first inverter (182) outputs low to the first input of the first NOR gate (184), the first NOR gate (184) outputs the inverse of the value coming from the third inverter (190). When CLK is high, the second inverter (188) outputs low to the third inverter (190), which, in turn, outputs high to both CK and the second input of the first NOR gate (184). The first NOR gate (184) then outputs low to both SE_CLK_1 and the sixth inverter (196), which, in turn, outputs high on SE_CLK_2.

When CLK is low, the second inverter (188) outputs high to both the second input of the NAND gate (186) and to the third inverter (190), which, in turn, outputs low to both CK and the second input of the first NOR gate (184). The first NOR gate (184) then outputs high to both SE_CLK_1 and the sixth inverter (196), which, in turn, outputs low on SE_CLK_2.

Note that SE_CLK_1 and SE_CLK_2, which are essentially derived from CLK, are complementary to each other during scan mode operations. Further, because CK_1 and CK_2 are high and low, respectively, they are said to be "stable" during scan mode operations. In other words, during scan mode operations, the values of CK_1 and CK_2 do not change due to changes in CLK.

Moreover, those skilled in the art will appreciate that the complementary nature of SE_CLK_1 and SE_CLK_2 during scan mode operations enables the flip-flop header block (180) to control specific behavior (discussed below with reference to FIG. 6b) within the flip-flop core block (200) (shown in FIG. 6b).

Note that the outputs from the flip-flop header block (180), SE_CLK_1, SE_CLK_2, CK_1, CK_2, and CK, constitute the control signals generated by the flip-flop header block (180) to control the flip-flop core block (200) (shown in FIG. 6b).

Those skilled in the art will appreciate that in other embodiments, the flip-flop header block (180) may input signals different than to those discussed above with reference to FIG. 6a. For example, instead of inputting a global clock signal, the flip-flop header block (180) may input a local clock signal, where the local clock signal serves as a clock only for the flip-flop header block (180) or where the local clock signal serves as a clock for a particular region of a computer system where the flip-flop header block (180) resides.

FIG. 6b shows an exemplary circuit schematic of a flip-flop core block (200) in accordance with an embodiment of the present invention. The flip-flop core block (200) conducts data operations dependent upon the control signals from the flip-flop header block (180) (shown in FIG. 6a).

The flip-flop core block (200) inputs CK_1, CK_2, SE_CLK_1, SE_CLK_2, and CK, which are provided as control signals by the flip-flop header block (180) (shown in FIG. 6a). Additionally, the flip-flop core block (200) has a data input, DATA, and a scan input, SI.

CK_1 and CK_2 serves as inputs to a first PMOS transistor (202) and a first NMOS transistor (204), respectively. The first PMOS transistor (202) and the first NMOS transistor (204) form a transmission gate (206).

DATA serves as an input to a seventh inverter (208), which, in turn, outputs to an input of the transmission gate (206). The transmission gate (206) outputs to a first node, DATA_SETUP, of the flip-flop core block (200).

DATA_SETUP is connected to a terminal of a second PMOS transistor (210), a terminal of a second NMOS transistor (212), and a terminal of a third NMOS transistor (214). Additionally, DATA_SETUP serves as an input to a fourth NMOS transistor (216). The second PMOS transistor (210), in addition to having a terminal connected to DATA_SETUP, has another terminal connected to a voltage source (218) (also referred to as "connected to high"). The second NMOS transistor (212), in addition to having a terminal connected to DATA_SETUP, has another terminal connected to ground (220) (also referred to as "connected to low"). Moreover, SE_CLK_1 serves as an input to the second NMOS transistor (212). The third NMOS transistor (214), in addition to having a terminal connected to DATA_SETUP, has another terminal connected to a terminal of a fifth NMOS transistor (224). The fifth NMOS transistor (224), in addition to having a terminal connected to a terminal of the third NMOS transistor (214), has another terminal connected to low (220). Furthermore, the second PMOS transistor (210), the third NMOS transistor (214), and the fifth NMOS transistor (224) form a "feedback" stage of the flip-flop core block (200).

CK serves as an input to a third PMOS transistor (226), an input to the third NMOS transistor (214), an input to a sixth NMOS transistor (228), and an input to a seventh NMOS transistor (230). The third PMOS transistor (226) has a terminal connected to high (218) and has another terminal connected to a dynamic node, DYN_NODE, of the flip-flop core block (200).

DYN_NODE is connected to a terminal of the fourth NMOS transistor (216), a terminal of an eighth NMOS transistor (232), and a terminal of a fourth PMOS transistor (234). Additionally, DYN_NODE serves as an input to the second PMOS transistor (210), an input to the fifth NMOS transistor (224), an input to an eighth inverter (236), an input to a fifth PMOS transistor (238), and an input to a ninth NMOS transistor (240). The fourth NMOS transistor (216), in addition to having a terminal connected to DYN_NODE, has another terminal connected to a terminal of the sixth NMOS transistor (228). The sixth NMOS transistor (228), in addition to having a terminal connected to a terminal of the fourth NMOS transistor (216), has another terminal connected to low (220). The eighth NMOS transistor (232), in addition to having a terminal connected to DYN_NODE, has another terminal connected to the terminal of the sixth NMOS transistor (228) that is connected to the terminal of the fourth NMOS transistor (216). The fourth PMOS transistor (234), in addition to having a terminal connected to DYN_NODE, has another terminal connected to high (218). Furthermore, the fourth NMOS transistor (216), the sixth NMOS transistor (228), and DYN_NODE form a "dynamic input stage" of the flip-flop core block (200).

The eighth inverter (236), which has its input connected to DYN_NODE, outputs to an input of the fourth PMOS transistor (234). The eighth inverter (236) and the fourth PMOS transistor (234) form a "keeper" on DYN_NODE.

The fifth PMOS transistor (238) has a terminal connected to high (218) and has another terminal connected both to a terminal of the seventh NMOS transistor (230) and to an input of a ninth inverter (242). The seventh NMOS transistor (230), in addition to having a terminal both connected to a terminal of the fifth PMOS transistor (238) and to the input of the ninth inverter (242), has another terminal connected a terminal of the ninth NMOS transistor (240). The ninth NMOS transistor (240), in addition to having a terminal connected to a terminal of the seventh NMOS transistor (230), has another terminal connected to low (220). The ninth inverter (242) generates the output, OUT, of the flip-flop core block (200). OUT is also connected to an input of a tenth inverter (244), which, in turn, outputs back to the input of the ninth inverter (242). Essentially, the ninth and tenth inverters (242, 244) form a latch that holds the value at OUT. Moreover, the fifth PMOS transistor (238), the seventh NMOS transistor (230), and the ninth NMOS transistor (240) form a "static output stage" of the flip-flop core block (200).

SE_CLK_2 serves as an input to a first input of a second NOR gate (246), which, in turn, outputs to a node, SCAN SETUP. The value on SCAN_SETUP serves as an input to the eighth NMOS transistor (232). SI serves as an input to a second input of the second NOR gate (246).

During normal mode operations, i.e., scan is disabled, the flip-flop header block (180) (shown in FIG. 6a) outputs low on SE_CLK_1 and high on SE_CLK_2. Because SE_CLK_1 is low, the second NMOS transistor (212) switches 'off' during normal mode operations. Because SE_CLK_2 is high during normal mode operations, the second NOR gate (246) outputs low on SCAN_SETUP regardless of the value of SI at its second input. This occurs because when one input to a NOR gate is high, the NOR gate outputs low regardless of the values at its other inputs. The low value on SCAN_SETUP outputted by the second NOR gate (246) during normal mode operations switches the eighth NMOS transistor (232) 'off.'

The precharge phase for the flip-flop core block (200) occurs when CK goes low. When CK goes low, the third PMOS transistor (226) switches 'on,' the third NMOS transistor (214) switches 'off,' the sixth NMOS transistor (228) switches 'off,' and the seventh NMOS transistor (230) switches 'off.' Because the third PMOS transistor (226) switches 'on,' DYN_NODE goes high due to it connected to high (218) through the 'on' third PMOS transistor (226). As DYN_NODE goes high, the second PMOS transistor (210) switches 'off,' the fifth NMOS transistor (224) switches 'on,' the fifth PMOS transistor (238) switches 'off,' and the ninth NMOS transistor (240) switches 'on.' Additionally, the input to the eighth inverter (236) goes high, and, as a result, the eighth inverter (236) outputs low to the input of the fourth PMOS transistor (234) causing the fourth PMOS transistor (234) to switch or remain 'on.' Because the fourth PMOS transistor (234) is switched 'on,' DYN_NODE also gets connected to high (218) through the 'on' fourth PMOS transistor (234). In essence, the eighth inverter (236) and the fourth PMOS transistor (234) are used to hold DYN_NODE when it is high.

During the precharge phase, i.e., when CK is low, CK_1 is low and CK_2 is high due to the behavior of the flip-flop header block (180) when CLK is low during normal mode operations (the generation of CK_1 and CK_2 during normal mode operations is discussed above with reference to FIG. 6a). Because CK_1 is low and CK_2 is high, the transmission gate (206) switches 'on' due to both the high value of CK_2 at the input of the first NMOS transistor (204) and the low value of CK_1 at the input of the first PMOS transistor (202). When the transmission gate (206) is switched 'on,' the output from the seventh inverter (208) passes through the transmission gate (206) to DATA_SETUP. Note that the output from the seventh inverter (208) is based on the value of DATA. The value that passes through the transmission gate (206) to DATA_SETUP resides on DATA_SETUP until the flip-flop core block (200) enters an evaluation phase.

The evaluation phase for the flip-flop core block (200) occurs when CK goes high. When CK goes high, the third PMOS transistor (226) switches 'off,' the third NMOS transistor (214) switches 'on,' the sixth NMOS transistor (228) switches 'on,' and the seventh NMOS transistor (230) switches 'on.' If the value on DATA_SETUP is high due to DATA being low at the start of the evaluation phase, then the fourth NMOS transistor (216) switches 'on.' In this case, at the start of the evaluation phase, DYN_NODE gets connected to low (220) through the 'on' fourth and sixth NMOS transistors (216, 228). When DYN_NODE goes low, the second PMOS transistor (210) switches 'on' causing a high value to be maintained on DATA_SETUP due to DATA_SETUP getting connected to high (218) through the 'on' second PMOS transistor (210).

Those skilled in the art will appreciate that because the high value on DATA_SETUP at the start of the evaluation phase is promptly maintained by a connection to high (218) through the second PMOS transistor (210), the amount of time that DATA has to be held constant after the start of the evaluation phase is lower than in cases when the input value based on DATA is not immediately maintained. Thus, the flip-flop core block (200) is said to have a "low hold time." Also, the maintaining of the value at DATA_SETUP promptly after the start of the evaluation phase is said to occur due to the behavior of the feedback stage (recall that the "feedback" stage refers to the second PMOS transistor (210), the third NMOS transistor (214), and the fifth NMOS transistor (224)). In this case, the second PMOS transistor (210), which is part of the feedback stage, is used to maintain the high value on DATA_SETUP.

Continuing the discussion with regard to when the value on DATA_SETUP is high due to DATA being low at the start of the evaluation phase, DYN_NODE, which goes low due to it getting connected to low (220) through the 'on' fourth and sixth NMOS transistors (216, 228), causes the fifth PMOS transistor (238) to switch 'on.' When the fifth PMOS transistor (238) switches 'on,' the input to the ninth inverter (242) gets connected to high (218) through the 'on' fifth PMOS transistor (238). The ninth inverter (242) then outputs low to both OUT and the tenth inverter (244). The tenth inverter (244), in turn, outputs high back to the input of the ninth inverter (242) to ensure that the low value on OUT is maintained during the current evaluation phase.

Alternatively, if the value on DATA_SETUP is low due to DATA being high at the start of the evaluation phase, then the fourth NMOS transistor (216) does not switch 'on.' Because the fourth NMOS transistor (216) does not switch 'on,' DYN_NODE remains high and the fifth and ninth NMOS transistors (224, 240) remain switched 'on.' Also recall that during the evaluation phase, CK is high, and therefore, the third, sixth, and seventh NMOS transistors (214, 228, 230) are switched 'on.' Because the third NMOS transistor (214) is switched 'on' due to CK being high and because the fifth NMOS transistor (224) remains switched 'on' due to DYN_NODE remaining high, DATA_SETUP gets connected to low (220) through the 'on' third and fifth NMOS transistors (214, 224). Thus, the low value on DATA_SETUP that was present due to the high value of DATA at the start of the evaluation phase is maintained by the connection to low (220) through the 'on' third and fifth NMOS transistors (214, 224).

Those skilled in the art will appreciate that because the low value on DATA_SETUP is promptly maintained by a connection to low (218) through the third and fifth NMOS transistors (214, 224), the amount of time that DATA has to be held constant after the start of the evaluation phase is lower than in cases when the input value based on DATA is not immediately maintained. Thus, similar to the case when DATA was low at the start of the evaluation phase, the flip-flop core block (200) is said to have a "low hold time." Also, the maintaining of the value at DATA_SETUP promptly after the start of the evaluation phase is said to occur due to the behavior of the feedback stage (recall that the "feedback" stage refers to the second PMOS transistor (210), the third NMOS transistor (214), and the fifth NMOS transistor (224)). In this case, the third NMOS transistor (214) and the fifth NMOS transistor (224), which are part of the feedback stage, are used to maintain the low value on DATA_SETUP.

Continuing the discussion with regard to when the value on DATA_SETUP is low due to DATA being high at the start of the evaluation phase, recall that because CK is high during the evaluation phase and because DYN_NODE remains high when DATA is high at the start of the evaluation phase, the seventh and ninth NMOS transistors (230, 240) are switched 'on.' Therefore, the input to the ninth inverter (242) gets connected to low (220) through the 'on' seventh and ninth NMOS transistors (230, 240). The ninth inverter (242) then outputs high to both OUT and the tenth inverter (244). The tenth inverter (244), in turn, outputs low back to the input of the ninth inverter (242) to ensure that the high value on OUT is maintained during the current evaluation phase.

Those skilled in the art will appreciate that because the flip-flop core block (200) requires very low hold time, the transmission gate (206) can switch 'off' virtually right after the start of the evaluation phase.

During scan mode operations, i.e., scan is enabled, the flip-flop header block (180) (shown in FIG. 6a) outputs high on CK_1 and low on CK_2. Because CK_1 is high, the first PMOS transistor (202) is switched 'off,' and because CK_2 is low, the first NMOS transistor (204) is switched 'on.' Thus, because the first PMOS transistor (202) and the first NMOS transistor (204) are switched 'off,' the transmission gate (206) is switched 'off,' and the value of DATA is cutoff from the rest of the flip-flop core block (200).

The precharge phase for the flip-flop core block (200) occurs when CK goes low. When CK goes low, the third PMOS transistor (226) switches 'on,' the third NMOS transistor (214) switches 'off,' the sixth NMOS transistor (228) switches 'off,' and the seventh NMOS transistor (230) switches 'off.' Because the third PMOS transistor (226) switches 'on,' DYN_NODE goes high due to it connected to high (218) through the 'on' third PMOS transistor (226). As DYN_NODE goes high, the second PMOS transistor (210) switches 'off,' the fifth NMOS transistor (224) switches 'on,' the fifth PMOS transistor (238) switches 'off,' and the ninth NMOS transistor (240) switches 'off.' Additionally, the input to the eighth inverter (236) goes high, and, as a result, the eighth inverter (236) outputs low to the input of the fourth PMOS transistor (234) causing the fourth PMOS transistor (234) to switch 'on.' Because the fourth PMOS transistor (234) switches 'on,' DYN_NODE also gets connected to high (218) through the 'on' fourth PMOS transistor (234). In essence, the eighth inverter (236) and the fourth PMOS transistor (234) are used to hold DYN_NODE when it is high.

During the precharge phase, i.e., when CK is low, SE_CLK_1 is high and SE_CLK_2 is low due to the behavior of the flip-flop header block (180) when CLK is low during scan mode operations (the generation of SE_CLK_1 and SE_CLK_2 during scan mode operations is discussed above with reference to FIG. 6a). Because SE_CLK_1 is high, the second NMOS transistor (212) switches 'on.' When the second NMOS transistor (212) switches 'on,' DATA_SETUP gets connected to low (220) through the 'on' second NMOS transistor (212). Thus, during scan mode operations, DATA_SETUP goes low during the precharge phase.

Because SE_CLK_2 is low in the precharge phase and because SE_CLK_2 serves as a first input to the second NOR gate (246), the second NOR gate (246) outputs the inverse of the value of SI at its second input. Therefore, the second NOR gate (246) outputs on SCAN_SETUP the inverse of the value of SI at its second input. However, the value on SCAN_SETUP is not evaluated by the flip-flop core block (200) until the evaluation phase. Those skilled in the art will appreciate that this is achieved by selectively delaying the signals received from the header block (180).

The evaluation phase for the flip-flop core block (200) occurs when CK goes high. When CK goes high, the third PMOS transistor (226) switches 'off,' the third NMOS transistor (214) switches 'on,' the sixth NMOS transistor (228) switches 'on,' and the seventh NMOS transistor (230) switches 'on.' Furthermore, because CK goes high, SE_CLK_1 goes low and SE_CLK_2 goes high (discussed above with reference to FIG. 6a).

If SI is low at the start of the evaluation phase and before the high value of SE_CLK_2 propagates to the output of the second NOR gate (246), the second NOR gate (246) outputs high on SCAN_SETUP due to both SI and SE_CLK_2 being low right before the start of the evaluation phase. The high value on SCAN_SETUP causes the eighth NMOS transistor (232) to switch 'on.' In this case, at the start of the evaluation phase, DYN_NODE goes low because it gets connected to low (220) through the 'on' eighth and sixth NMOS transistors (232, 228). When DYN_NODE goes low, the second PMOS transistor (210) switches 'on' causing a high value to be maintained on DATA_SETUP due to DATA_SETUP getting connected to high (218) through the 'on' second PMOS transistor (210). Note that when CK goes high at the start of the evaluation phase, the second NMOS transistor (212) switches 'off' causing DATA_SETUP to lose its connection to ground (220). Because DATA_SETUP goes high, the fourth NMOS transistor (216) switches 'on,' and DYN_NODE gets connected to low (220) through the 'on' fourth and sixth NMOS transistors (216, 228).

Those skilled in the art will appreciate that because the low value on DYN_NODE is maintained by a connection to low (220) through the fourth and sixth NMOS transistors (216, 228), the amount of time that SI has to be held constant after the start of the evaluation phase is lower than in cases when the input value based on SI is not immediately maintained. Thus, the flip-flop core block (200) is said to have a "low hold time." In other words, as soon as the connection between DYN_NODE and ground (220) is established through the fourth and sixth NMOS transistors (216, 228), SI can toggle back high. Also note that the value on SCAN_SETUP at the start of the evaluation phase is basically fed back to DATA_SETUP. Also, the maintaining of the value at DATA_SETUP promptly after the start of the evaluation phase is said to occur due to the behavior of the feedback stage (recall that the "feedback" stage refers to the second PMOS transistor (210), the NMOS transistor (214), and the fifth NMOS transistor (224)). In this case, the second PMOS transistor (210), which is part of the feedback stage, is used to maintain the high value on DATA_SETUP.

Continuing the discussion with regard to when the value on SCAN_SETUP is high at the start of the evaluation phase, DYN_NODE, which is now held low due to its connection to low (220) through the fourth and sixth NMOS transistors (216, 228), causes the fifth PMOS transistor (238) to switch 'on.' When the fifth PMOS transistor (238) switches 'on,' the input to the ninth inverter (242) gets connected to high (218) through the 'on' fifth PMOS transistor (238). The ninth inverter (242) then outputs low to both OUT and the tenth inverter (244). The tenth inverter (244), in turn, outputs high back to the input of the ninth inverter (242) to ensure that the low value on OUT is maintained during the current evaluation phase.

Alternatively, if the second NOR gate (246) outputs low on SCAN_SETUP due to SI being high at the start of the evaluation phase, then the eighth NMOS transistor (232) is not switched 'on' at the start of the evaluation phase. Because the eighth NMOS transistor (232) does not switch 'on,' DYN_NODE remains high and the fifth and ninth NMOS transistors (224, 240) remain switched 'on.'. Also recall that during the evaluation phase, CK is high, and therefore, the third, sixth, and seventh NMOS transistors (214, 228, 230) are switched 'on.' Those skilled in the art will appreciate that because the high value on DYN_NODE is maintained by a connection to high (218) via the "keeper" configuration of the eighth inverter (236) and the fourth PMOS transistor (234), the amount of time that SI has to be held constant after the start of the evaluation phase is lower than in cases when the value on DYN_NODE based on SI is not immediately maintained. Thus, the flip-flop core block (200) is said to have a "low hold time."

Continuing the discussion with regard to when the second NOR gate (246) outputs low on SCAN_SETUP due to SI being high at the start of the evaluation phase, recall that because CK is high during the evaluation phase and because DYN_NODE remains high when SI is high at the start of the evaluation phase, the seventh and ninth NMOS transistors (230, 240) are switched 'on.' Therefore, the input to the ninth inverter (242) gets connected to low (220) through the 'on' seventh and ninth NMOS transistors (230, 240). The ninth inverter (242) then outputs high to both OUT and the tenth inverter (244). The tenth inverter (244), in turn, outputs low back to the input of the ninth inverter (242) to ensure that the high value on OUT is maintained during the current evaluation phase.

Those skilled in the art will appreciate that the transistors of the flip-flop core block (200) may be selectively sized to effectuate particular behavior. Furthermore, because the values from DATA and SI during normal mode and scan mode operations, respectively, are maintained immediately by the flip-flop core block (200), the amount of time that the values on DATA and SI must be maintained by circuitry or components outside the flip-flop core block (200) is decreased.

Figure 7A:
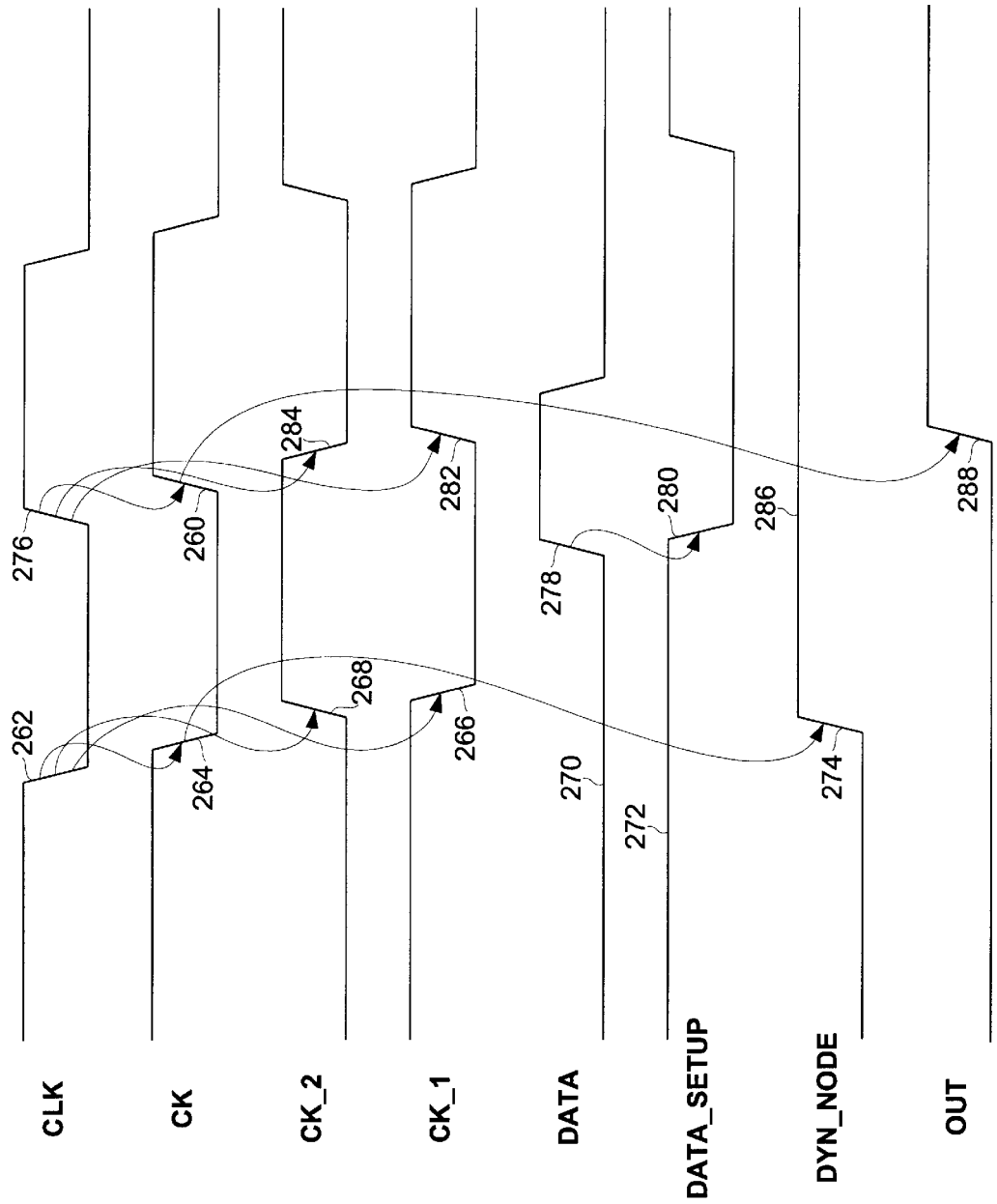
FIG. 7a shows a timing diagram in accordance with the embodiments shown in FIGS. 6a and 6b.

FIG. 7a shows an exemplary timing diagram in accordance with the embodiments shown in FIGS. 6a and 6b. The timing diagram of FIG. 7a shows the behavior of CLK, CK, CK_1, CK_2, DATA, DATA_SETUP, DYN_NODE, and OUT during normal mode operations. More particularly, the timing diagram of FIG. 7a shows the behavior of the flip-flop core block (200) when DATA is high at the start of the evaluation phase, i.e., at the rising edge of CK (260).

When CLK goes low (262), CK accordingly follows low (264) (due to the behavior of the flip-flop header block (180) discussed above with reference to FIG. 6a). Recall that when CK goes low (264), the flip-flop core block (200) enters a precharge phase. Further, during normal mode operations, i.e., scan is disabled, as CLK goes low (262), CK_1 goes low (266) and CK_2 goes high (268) (due to the behavior of the flip-flop header block (200) discussed above with reference to FIG. 6a).

When CK_1 goes low (266) and CK_2 goes high (268), the transmission gate (206) (shown in FIG. 6b) switches 'on' allowing the inverted value of DATA to pass through it. In the exemplary timing diagram of FIG. 7a, when CK goes low (264), DATA is low (270), and the seventh inverter (208) outputs high through the 'on' transmission gate (206) to DATA_SETUP causing DATA_SETUP to remain high (272) (DATA_SETUP was high before CK went low (264)). Furthermore, when CK goes low (264), the third PMOS transistor (226) switches 'on' causing DYN_NODE to go high (274) due to DYN_NODE getting connected to high (218) through the 'on' third PMOS transistor (226).

Before CLK goes back high (276), and consequently before CK goes back high (260), DATA toggles high (278). Because DATA goes high (278) during the precharge phase, the seventh inverter (208) outputs low to DATA_SETUP causing DATA_SETUP to go low (280). As CK goes high (260) due to CLK going high (276), the flip-flop core block (200) enters an evaluation phase. When CK goes high (260), CK_1 goes high (282) and CK_2 goes low (284) (due to the behavior of the flip-flop header block (180) discussed above with reference to FIG. 6a). As CK_1 goes high (282) and CK_2 goes low (284), the transmission gate (206) switches 'off' causing the output of the seventh inverter (208) to be cutoff from the rest of the flip-flop core block (200).

Upon entering the evaluation phase, because DATA_SETUP remains low (280), DYN_NODE remains high (286) because the low value on DATA_SETUP does not switch the fourth NMOS transistor (216) 'on' and because the "keeper" configuration of the eighth inverter (236) and the fourth PMOS transistor (234) maintains the high value on DYN_NODE. Thus, the ninth NMOS transistor (240) remains switched 'on' due to DYN_NODE remaining high (286) and the seventh NMOS transistor (230) remains switched 'on' due to CK going high (260). It follows that because both the seventh and ninth NMOS transistors (230, 240) are switched 'on' when CK goes high (260), the input to the ninth inverter (242) gets connected to low (220) through seventh and ninth NMOS transistors (230, 240), and OUT goes high (288) due to the ninth inverter (242) outputting high on OUT. Those skilled in the art will appreciate that as long as the value on DATA is high for a small period of time after CK goes high, i.e., the start of an evaluation phase, DATA can toggle back low, i.e., low hold time.

Figure 7B:
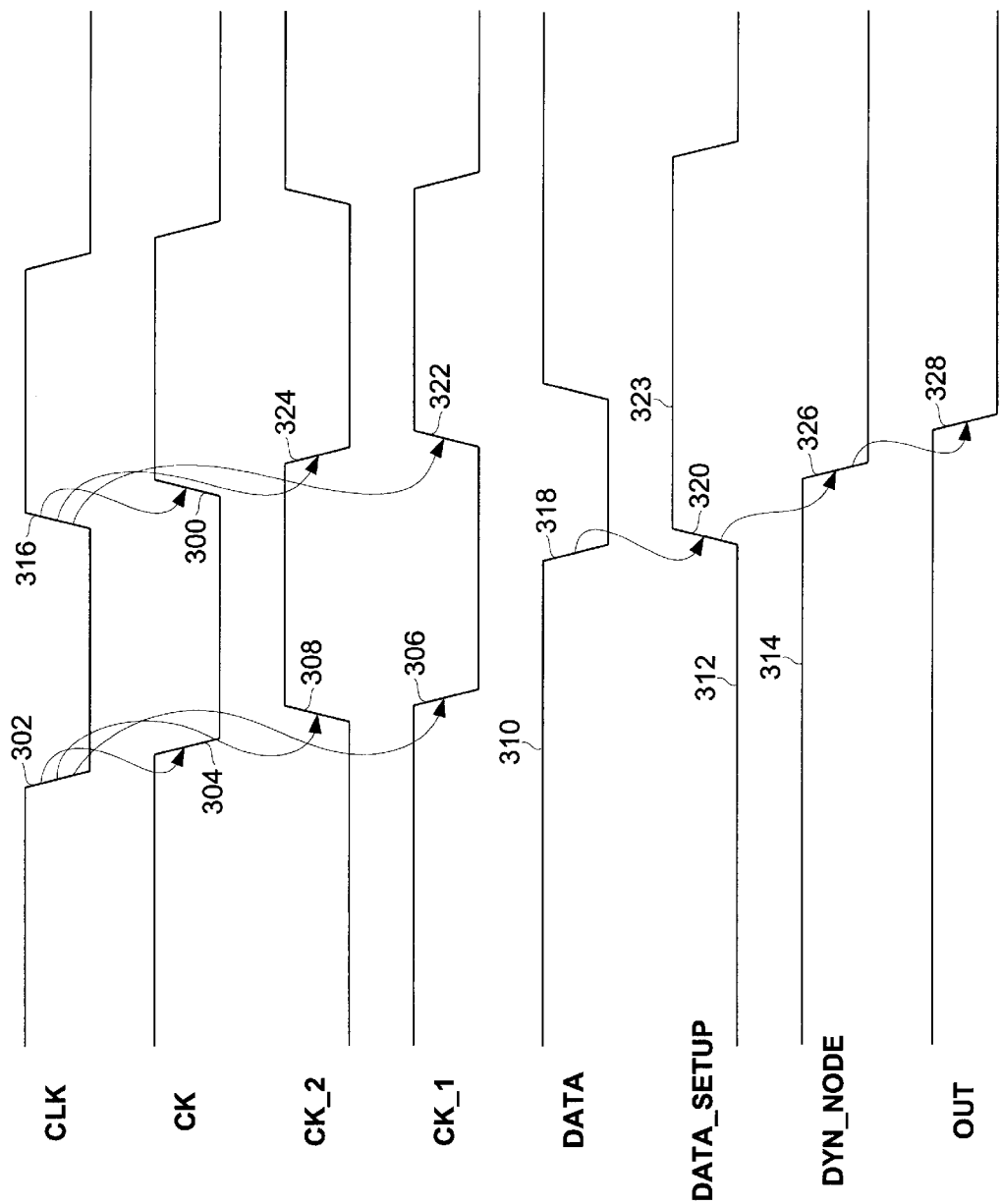
FIG. 7b shows another timing diagram in accordance with the embodiments shown in FIGS. 6a and 6b.

FIG. 7b shows an exemplary timing diagram in accordance with the embodiments shown in FIGS. 6a and 6b. The timing diagram of FIG. 7b shows the behavior of CLK, CK, CK_1, CK_2, DATA, DATA_SETUP, DYN_NODE, and OUT during normal mode operations. More particularly, the timing diagram of FIG. 7b shows the behavior of the flip-flop core block (200) when DATA is low at the start of the evaluation phase, i.e., at the rising edge of CK (300).

When CLK goes low (302), CK accordingly follows low (304) (due to the behavior of the flip-flop header block (180) discussed above with reference to FIG. 6a). Recall that when CK goes low (302), the flip-flop core block (200) enters a precharge phase. Further, during normal mode operations, i.e., scan is disabled, as CLK goes low (302), CK_1 goes low (306) and CK_2 goes high (308) (due to the behavior of the flip-flop header block (180) discussed above with reference to FIG. 6a).

When CK_1 goes low (306) and CK_2 goes high (308), the transmission gate (206) (shown in FIG. 6b) switches 'on' allowing the inverted value of DATA to pass through it. In the exemplary timing diagram of FIG. 7b, when CK goes low (304), DATA is high (310), and the seventh inverter (208) outputs low through the 'on' transmission gate (206) to DATA_SETUP causing DATA_SETUP to go or remain low (312). Furthermore, when CK goes low (304), the third PMOS transistor (226) switches 'on' causing DYN_NODE to go or remain high (314) due to DYN_NODE getting connected to high (218) through the 'on' third PMOS transistor (226).

Before CLK goes back high (316), and consequently before CK goes back high (300), DATA toggles low (318). Because DATA goes low (318) during the precharge phase, the seventh inverter (208) outputs high to DATA_SETUP causing DATA_SETUP to go high (320). As CK goes high (300) due to CLK going high (316), the flip-flop core block (200) enters an evaluation phase. When CK goes high (300), CK_1 goes high (322) and CK_2 goes low (324) (due to the behavior of the flip-flop header block (180) discussed above with reference to FIG. 6a). As CK_1 goes high (322) and CK_2 goes low (324), the transmission gate (206) switches 'off' causing the output of the seventh inverter (208) to be cutoff from the rest of the flip-flop core block (200).

Upon entering the evaluation phase, because DATA_SETUP remains high (320), the fourth NMOS transistor (216) switches 'on' causing DYN_NODE to go low (326) due to DYN_NODE getting connected to low (220) through the fourth and sixth NMOS transistors (216, 228) (recall that the sixth NMOS transistor (228) switches 'on' when CK goes high (300)). Because DYN_NODE goes low (326), the second PMOS transistor (210) switches 'on' causing DATA_SETUP to get connected to high (218) through the second PMOS transistor (210). Thus, in effect, after the start of the evaluation phase, DATA_SETUP is maintained high (323) during the rest of evaluation phase regardless of changes in DATA.

When DYN_NODE goes low (326), the fifth PMOS transistor (238) switches 'on,' causing the input of the ninth inverter (242) to get connected to high (218) through the fifth PMOS transistor (242). The ninth inverter (242) then outputs low causing OUT to go low (328).

Figure 8A:
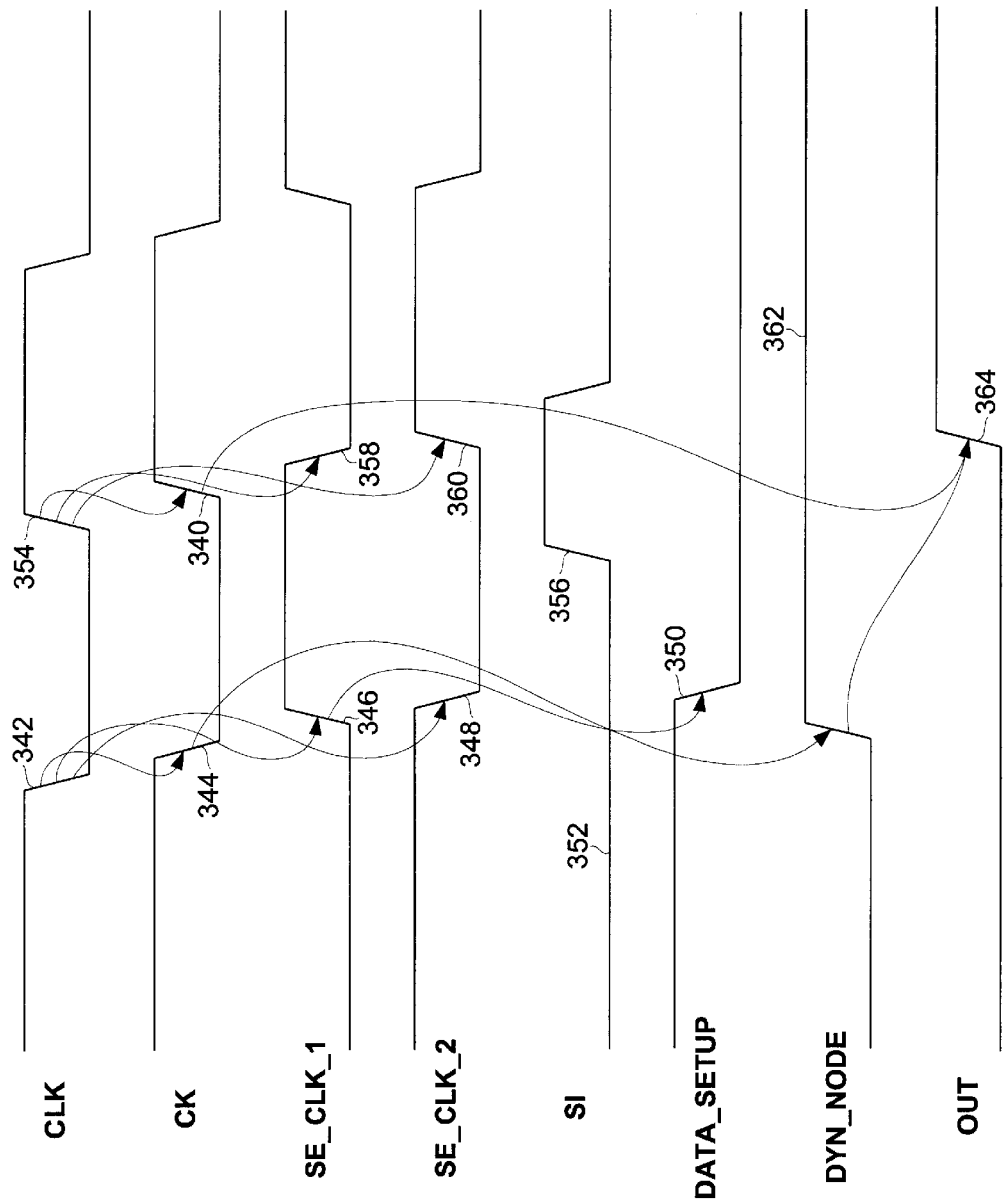
FIG. 8a shows another timing diagram in accordance with the embodiments shown in FIGS. 6a and 6b.

FIG. 8a shows an exemplary timing diagram in accordance with the embodiments shown in FIGS. 6a and 6b. The timing diagram of FIG. 8a shows the behavior of CLK, CK, SE_CLK_1, SE_CLK_2, SI, DATA_SETUP, DYN_NODE, and OUT during scan mode operations. More particularly, the timing diagram of FIG. 8a shows the behavior of the flip-flop core block (200) when SI is high at the start of the evaluation phase, i.e., at the rising edge of CK (340).

When CLK goes low (342), CK accordingly follows low (344) (due to the behavior of the flip-flop header block (180) discussed above with reference to FIG. 6a). Recall that when CK goes low (344), the flip-flop core block (200) enters a precharge phase. Further, during scan mode operations, i.e., scan is enabled, as CK goes low (344), SE_CLK_1 goes high (346) and SE_CLK_2 goes low (348) (due to the behavior of the flip-flop header block (180) discussed above with reference to FIG. 6a).

When SE_CLK_1 goes high (346), the second NMOS transistor (212) switches 'on' causing DATA_SETUP to go low (350) due to DATA_SETUP getting connected to low (220) through the second NMOS transistor (212). Further, when SE_CLK_2 goes low (348), the second NOR gate (246) outputs on SCAN_SETUP the inverse of the value of SI at its second input. In the exemplary timing diagram of FIG. 8a, when CK goes low (344), SI is low (352), and thus the second NOR gate (246) outputs high on SCAN_SETUP causing the eighth NMOS transistor (232) to switch or remain 'on.' However, because the sixth NMOS transistor (228) is switched 'off' due to CK being low, DYN_NODE does not get connected to low (220) through the eighth and sixth NMOS transistors (232, 228).

Before CLK goes back high (354), and consequently before CK goes back high (340), SI toggles high (356). Because SI goes high (356) during the precharge phase, the second NOR gate (246) outputs low on SCAN_SETUP causing the eighth NMOS transistor (232) to switch 'off.' As CK goes high (340) due to CLK going high (354), the flip-flop core block (200) enters an evaluation phase. When CK goes high (340), SE_CLK_1 goes low (358) and SE_CLK_2 goes high (360) (due to the behavior of the flip-flop header block (180) discussed above with reference to FIG. 6a). As SE_CLK_1 goes low (358), the second NMOS transistor (212) switches 'off,' and as SE_CLK_2 goes high (360), the second NOR gate (246) outputs low on SCAN_SETUP causing the eighth NMOS transistor (232) to remain or switch 'off.'

Upon entering the evaluation phase, because DYN_NODE remains high (362) due to the "keeper" configuration of the eighth inverter (236) and the fourth PMOS transistor (234), the ninth NMOS transistor (240) is switched 'on,' and because CK is high (340), the seventh NMOS transistor (230) is switched 'on.' Thus, the input to the ninth inverter (242) goes low due to it getting connected to low (220) through the 'on' seventh and ninth NMOS transistors (230, 240). Thereafter, the ninth inverter (242) outputs high causing OUT to go high (364).

Figure 8B:
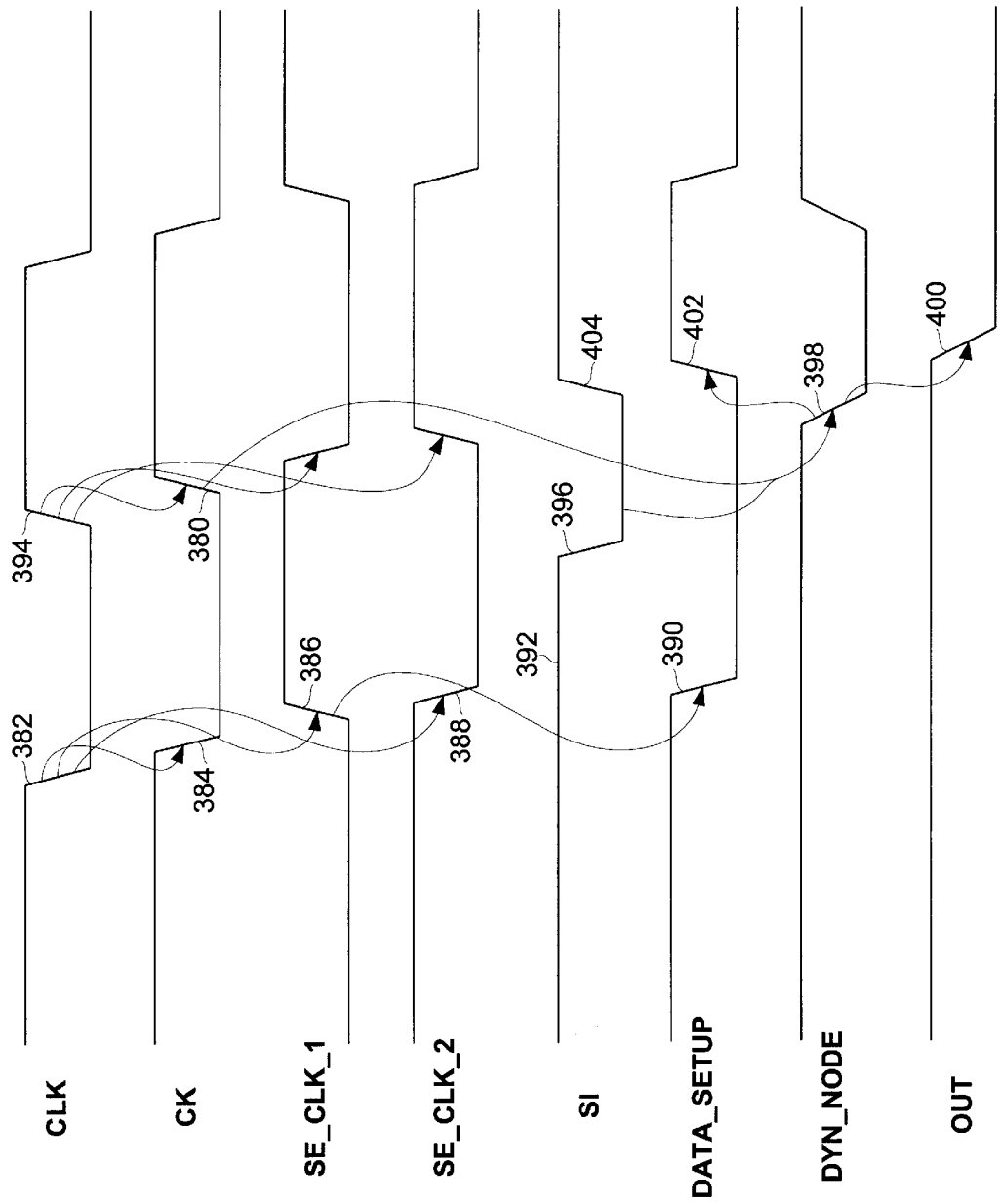
FIG. 8b shows another timing diagram in accordance with the embodiments shown in FIGS. 6a and 6b.

FIG. 8b shows an exemplary timing diagram in accordance with the embodiments shown in FIGS. 6a and 6b. The timing diagram of FIG. 8b shows the behavior of CLK, CK, SE_CLK_1, SE_CLK_2, SI, DATA_SETUP, DYN_NODE, and OUT during scan mode operations. More particularly, the timing diagram of FIG. 8b shows the behavior of the flip-flop core block (200) when SI is low at the start of the evaluation phase, i.e., at the rising edge of CK (380).

When CLK goes low (382), CK accordingly follows low (384) (due to the behavior of the flip-flop header block (180) discussed above with reference to FIG. 6a). Recall that when CK goes low (384), the flip-flop core block (200) enters a precharge phase. Further, during scan mode operations, i.e., scan is enabled, as CK goes low (384), SE_CLK_1 goes high (386) and SE_CLK_2 goes low (388) (due to the behavior of the flip-flop header block (180) discussed above with reference to FIG. 6a).

When SE_CLK_1 goes high (386), the second NMOS transistor (212) switches 'on' causing DATA_SETUP to go low (390) due to DATA_SETUP getting connected to low (220) through the second NMOS transistor (212). Further, when SE_CLK_2 goes low (388), the second NOR gate (246) outputs on SCAN_SETUP the inverse of the value of SI at its second input. In the exemplary timing diagram of FIG. 8b, when CK goes low (384), SI is high (392), and the second NOR gate (246) outputs low on SCAN_SETUP causing the eighth NMOS transistor (246) to switch or remain 'off.'

Before CLK goes back high (394), and consequently before CK goes back high (380), SI toggles low (396). Because SI goes low (396) during the precharge phase, the second NOR gate (246) outputs high on SCAN_SETUP causing the eighth NMOS transistor (246) to switch 'on.' As CK goes high (380) due to CLK going high (394), the flip-flop core block (200) enters an evaluation phase.

Upon entering the evaluation phase, CK goes high (380), and as a result, the sixth NMOS transistor (228) switches 'on' causing DYN_NODE to go low (398) due to DYN_NODE getting connected to low (220) through the 'on' eighth and sixth NMOS transistors (232, 228) (recall that the eighth NMOS transistor (232) is switched 'on' immediately at the start of the evaluation phase due to the high value on SCAN_SETUP outputted from the second NOR gate (246) during the precharge phase). When DYN_NODE goes low (398), the fifth PMOS transistor (238) switches 'on' causing the input of the ninth inverter (242) to go high due to it getting connected to high (218) through the fifth PMOS transistor (238). The ninth inverter (242) then outputs low causing OUT to go low (400). Note that as soon as DYN_NODE goes low (398), the second PMOS transistor (210) switches 'on' causing DATA_SETUP to have a connection to high (218) through the second PMOS transistor (210). Thus, as soon as DYN_NODE goes low (398), DATA_SETUP goes high (402). This behavior allows SI to toggle back high (404) after the start of the evaluation phase.

Advantages of the present invention may include one or more of the following. In one or embodiments, because a low hold time statisized dynamic flip-flop latches a data input value or a scan input value immediately after the start of an evaluation phase of the low hold time statisized dynamic flip-flop, the hold time needed to keep the data input value or scan input value constant after the start of the evaluation phase is reduced.

In some embodiments, because no delays are added at a data input or scan input of a low hold time statisized dynamic flip-flop to effectuate lower hold times, setup times for the low hold time statisized dynamic flip-flop may remain close to zero.

In some embodiments, a low hold time statisized dynamic flip-flop needs less time to discharge a dynamic node because only two transistors are used in a pulldown path for the dynamic node.

In some embodiments, a low hold time statisized dynamic flip-flop uses feedback to maintain a value on a dynamic node, and therefore, additional transistors are not needed to maintain the value on the dynamic node.

In some embodiments, because a low hold time statisized dynamic flip-flop uses a dynamic input stage and a static output stage, performance is increased.

In some embodiments, because a low hold time statisized dynamic flip-flop requires less hold time for its data type inputs, the low hold time statisized dynamic flip-flop can be used in an increased number of other circuits or systems due to the fact the other circuits or systems will need less modification. In other words, other circuit or systems that use the low hold time statisized dynamic flip-flop will not have to be modified to support higher hold times.

In some embodiments, a low hold time statisized dynamic flip-flop can conduct scan mode functions in addition to normal mode functions. Thus, the low hold time statisized dynamic flip-flop can be used for both data and scan operations.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A flip-flop, comprising:
   a data setup node on which, when in a normal mode, a first setup value resides during a precharge phase, wherein the first setup value is dependent on a data input to the flip-flop;
   a dynamic input stage, responsive to the data setup node, that selectively establishes a value on a dynamic node during an evaluation phase;
   a feedback stage, responsive to the dynamic node, that selectively establishes a value on the data setup node during the evaluation phase; and
   a static output stage, responsive to the dynamic node, that outputs to an output of the flip-flop.

2. The flip-flop of claim 1, wherein the value selectively established on the data setup node by the feedback stage selectively maintains the value on the dynamic node during the evaluation phase.

3. The flip-flop of claim 1, wherein the feedback stage selectively establishes the value on the data setup node when the flip-flop is in a normal mode.

4. The flip-flop of claim 1, wherein the feedback stage selectively establishes the value on the data setup node when the flip-flop is in a scan mode.

5. The flip-flop of claim 1, wherein the data input to the flip-flop transitions to a different value after the start of the evaluation phase.

6. The flip-flop of claim 1, wherein the feedback stage comprises a plurality of transistors that are dependent on the value on the dynamic node and a clock input to the flip-flop.

7. The flip-flop of claim 1, further comprising:
   a scan setup node on which, when in a scan mode, a second setup value resides during the precharge phase, wherein the second setup value is dependent on a scan input to the flip-flop.

8. The flip-flop of claim 7, wherein the value selectively established on the dynamic node by the dynamic input stage depends on the second setup value.

9. The flip-flop of claim 7, wherein the scan input to the flip-flop transitions to a different value after the start of the evaluation phase.

10. A method for performing low hold time operations using a flip-flop, comprising:
    when in a normal mode, inputting a first setup value onto a data setup node during a precharge phase, wherein the first setup value is dependent on a data input to the flip-flop;
    selectively establishing a value on a dynamic node during an evaluation phase, wherein the dynamic node is responsive to the data setup node; and
    selectively establishing a value on the data setup node during the evaluation phase, wherein the value established on the data setup node is dependent on the value on the dynamic node.

11. The method of claim 10, wherein the value selectively established on the data setup node is done by a feedback stage.

12. The method of claim 10, wherein the value selectively established on the data setup node maintains the value on the dynamic node during the evaluation phase.

13. The method of claim 12, wherein the feedback stage is selectively controlled by the value on the dynamic node.

14. The method of claim 12, wherein the feedback stage selectively establishes the value on the data setup node when the flip-flop is in a normal mode.

15. The method of claim 12, wherein the feedback stage selectively establishes the value on the data setup node when the flip-flop is in a scan mode.

16. The method of claim 10, wherein the data input to the flip-flop transitions to a different value after the start of the evaluation phase.

17. The method of claim 10, wherein the feedback stage comprises a plurality of transistors that are dependent on the value on the dynamic node and a clock input to the flip-flop.

18. The method of claim 10, wherein the value on the dynamic node selectively controls a static output stage, and wherein the static output stage outputs to an output of the flip-flop.

19. The method of claim 10, further comprising:
    when in a scan mode, inputting a second setup value onto a scan setup node during a precharge phase, wherein the second setup value is dependent on a scan input to the flip-flop; and
    selectively establishing the value on the dynamic node during the evaluation phase, wherein the value established on the dynamic node is dependent on the second setup value.

20. The method of claim 19, wherein the scan input to the flip-flop transitions to a different value after the start of the evaluation phase.

21. A flip-flop, comprising:

means for inputting a first setup value onto a data setup node during a precharge phase when in a normal mode, wherein the first setup value is dependent on a data input to the flip-flop;

means for establishing a value on a dynamic node during an evaluation phase, wherein the dynamic node is responsive to the data setup node;

means for controlling the data setup node during the evaluation phase; and output means for outputting to an output of the flip-flop, wherein the output means is responsive to the dynamic node.

22. The flip-flop of claim 21, further comprising:

means for inputting a second setup value onto a scan setup node during the precharge phase when in a scan mode, wherein the second setup value is dependent on a scan input to the flip-flop.

\* \* \* \* \*